(12) United States Patent
Das Sharma

(10) Patent No.: US 11,573,920 B2
(45) Date of Patent: Feb. 7, 2023

(54) SERDES LINK TRAINING

(71) Applicant: Intel Corporation, Santa Clara, CA (US)

(72) Inventor: Debendra Das Sharma, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 17/373,508

(22) Filed: Jul. 12, 2021

(65) Prior Publication Data

US 2021/0342288 A1 Nov. 4, 2021

Related U.S. Application Data

(63) Continuation of application No. 15/811,951, filed on Nov. 14, 2017.

(Continued)

(51) Int. Cl.
*G06F 13/42* (2006.01)
*G06F 12/1027* (2016.01)
(Continued)

(52) U.S. Cl.
CPC ...... *G06F 13/4282* (2013.01); *G06F 12/0238* (2013.01); *G06F 12/1009* (2013.01); *G06F 12/1027* (2013.01); *G06F 13/4022* (2013.01); *G06F 13/4072* (2013.01); *G11C 7/00* (2013.01); *G11C 29/022* (2013.01); *G11C 29/028* (2013.01); *G06F 2212/202* (2013.01); *G06F 2212/65* (2013.01); *G06F 2212/68* (2013.01);

(Continued)

(58) Field of Classification Search
CPC .................................................. G06F 13/4282
See application file for complete search history.

(56) References Cited

U.S. PATENT DOCUMENTS

| 4,621,366 A | 11/1986 | Cain et al. |
| 7,353,443 B2 | 4/2008 | Sharma |

(Continued)

OTHER PUBLICATIONS

German Patent Office; Office Action issued in DE Patent Application No. 102018005753.5, dated Oct. 20, 2021; 10 pages.

(Continued)

*Primary Examiner* — Henry Tsai
*Assistant Examiner* — Juanito C Borromeo
(74) *Attorney, Agent, or Firm* — Alliance IP, LLC

(57) ABSTRACT

Aspects of the embodiments are directed to systems and methods for performing link training using stored and retrieved equalization parameters obtained from a previous equalization procedure. As part of a link training sequence, links interconnecting an upstream port with a downstream port and with any intervening retimers, can undergo an equalization procedure. The equalization parameter values from each system component, including the upstream port, downstream port, and retimer(s) can be stored in a nonvolatile memory. During a subsequent link training process, the equalization parameter values stored in the nonvolatile memory can be written to registers associated with the upstream port, downstream port, and retimer(s) to be used to operate the interconnecting links. The equalization parameter values can be used instead of performing a new equalization procedure or can be used as a starting point to reduce latency associated with equalization procedures.

27 Claims, 19 Drawing Sheets

Related U.S. Application Data

(60) Provisional application No. 62/548,857, filed on Aug. 22, 2017.

(51) Int. Cl.
  *G06F 12/1009* (2016.01)
  *G06F 12/02* (2006.01)
  *G06F 13/40* (2006.01)
  *G11C 29/02* (2006.01)
  *G11C 7/00* (2006.01)

(52) U.S. Cl.
  CPC ........... *G06F 2213/0026* (2013.01); *G06F 2213/4002* (2013.01)

(56) References Cited

U.S. PATENT DOCUMENTS

| | | |
|---|---|---|
| 8,437,343 B1 | 5/2013 | Wagh et al. |
| 8,599,913 B1 | 12/2013 | Brown et al. |
| 8,856,573 B2 | 10/2014 | Meir |
| 9,141,577 B2 | 9/2015 | Wagh et al. |
| 9,146,848 B2 | 9/2015 | Foltin et al. |
| 9,645,965 B2 | 5/2017 | Sharma et al. |
| 2005/0270988 A1 | 12/2005 | DeHaemer |
| 2013/0051483 A1 | 2/2013 | Wyatt et al. |
| 2014/0281067 A1 | 9/2014 | Sharma et al. |

OTHER PUBLICATIONS

German Patent Office; Office Action issued in DE Patent Application No. 102018010446.0, dated Oct. 20, 2021; 14 pages.

SERDES LINK TRAINING

CROSS REFERENCE TO RELATED APPLICATION

This Application is a continuation (and claims the benefit of priority under 35 U.S.C. § 120) of U.S. application Ser. No. 15/811,951, filed Nov. 14, 2017, and entitled "SERDES LINK TRAINING," which application claims the benefit of U.S. Provisional Application No. 62/548,857, filed on Aug. 22, 2017, and entitled "SAVING AND RESTORING EQUALIZATION PARAMETERS AND OTHER SETTINGS." The disclosures of the prior applications are considered part of and are hereby incorporated by reference in their entirety in the disclosure of this application.

BACKGROUND

Serializer/deserializer (SERDES) links are used for communication in computing systems. A SERDES link includes a serializer to serialize outgoing parallel data, such as data from a link, into serial data. The SERDES link also includes a deserializer to deserialize incoming serial data to parallel data. A SERDES link is popular in computing systems employing high speed, power efficient communications.

Interconnects can be used to provide communication between different devices within a system, some type of interconnect mechanism is used. One typical communication protocol for communications interconnects between devices in a computer system is a Peripheral Component Interconnect Express (PCI Express™ (PCIe™)) communication protocol. This communication protocol is one example of a load/store input/output (I/O) interconnect system. The communication between the devices is typically performed serially according to this protocol at very high speeds.

Devices can be connected across various numbers of data links, each data link including a plurality of data lanes. Upstream devices and downstream devices undergo link training upon initialization to optimize data transmissions across the various links and lanes.

DETAILED DESCRIPTION

Figure 1:
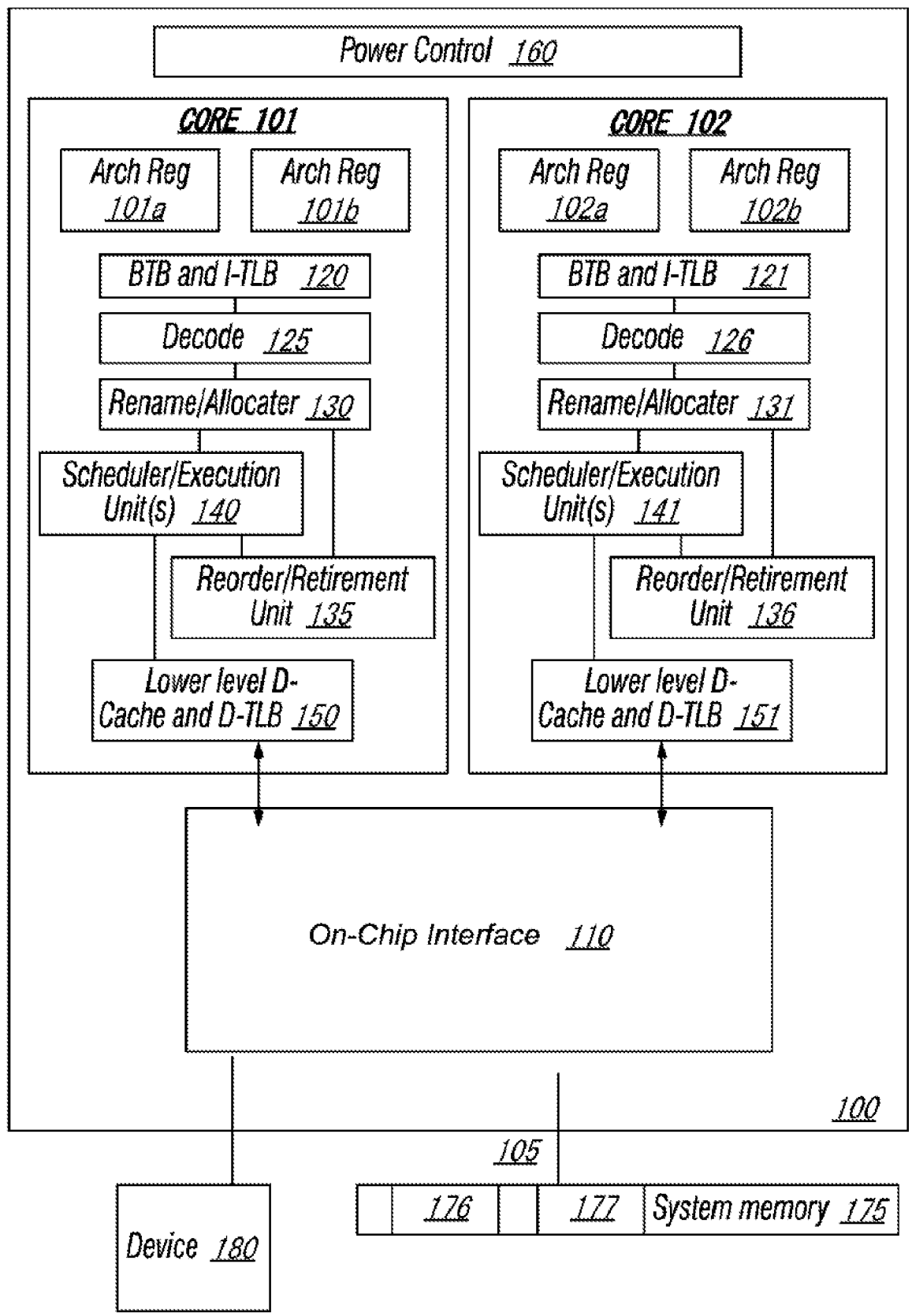
FIG. 1 illustrates an embodiment of a block diagram for a computing system including a multicore processor.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages, and operation, etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatuses, methods, and systems described herein are not limited to physical computing devices, but may also relate to software optimizations for energy conservation and efficiency.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. For the purposes of the present document, the phrase "A or B" means (A), (B), or (A and B).

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In some embodiments, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 101a, and 101b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101*a* and 101*b* are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 11 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, nonvolatile memory (NV memory), and other known storage devices. Device 180 may include a graphic accelerator, processor, or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core) configuration. As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Embodiments herein relate to systems and methods to reduce an amount of time to link train interconnects, such as Peripheral Component Interconnect Express (PCIe) Express. During link training, the transmitter(s) and receiver(s) can undergo equalization. The equalization process runs uninterrupted for about 100 ms for each Data Rate above Gen 2. Hence, equalization is typically performed prior to establishing the link, in order to avoid transactions timing out due to the link being unavailable during equalization. Since equalization is unique for each data rate, equalization is performed sequentially for each of the data rates above Gen 2, as shown in FIG. 2.

Figure 2:
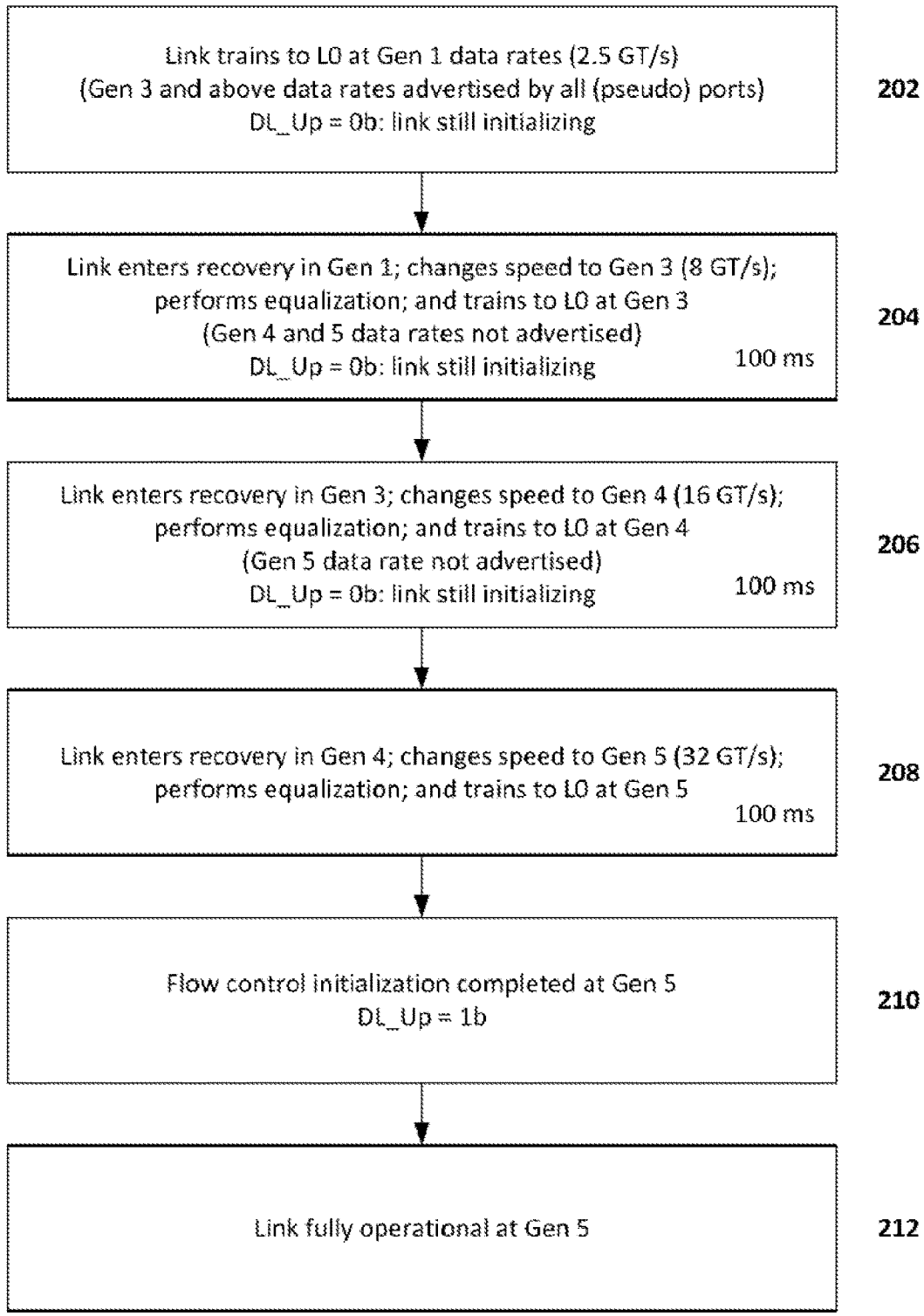
FIG. 2 is a process flow diagram for link training links between two devices.

FIG. 2 is a process flow diagram 200 for link training links between two devices. At the outset, the link is trained to L0 at Gen 1 data rates (2.5 GT/s) (202). The Gen 3 and above data rates advertised by all (pseudo) ports. The link enters recovery in Gen 1 and changes speed to Gen 3 (8 GT/s) for link training (204). The link can perform equalization and trains to L0 at Gen 3. Gen 4 and 5 data rates are not advertised. The equalization portion of the Gen 3 link training can take about 100 ms. The link enters recovery in Gen 3 and changes speed to Gen 4 (16 GT/s) for link training (206). The link can performs equalization, which can take another 100 ms. The link trains to L0 at Gen 4, while the Gen 5 data rate is not advertised. The link enters recovery in Gen 4 and changes speed to Gen 5 (32 GT/s) for link training (208). The link performs equalization at Gen 5 speed, which can take another 100 ms. After that, the link trains to L0 at Gen 5. Flow control initialization can be completed at Gen 5 (210), which results in the link being fully operational at Gen 5 (212). The process flow 200 can occur each time the devices are initialized (e.g., at the factory, and also upon power-up sequences).

The latency that results from the sequential equalization process for each data rate adds to the link training time, during which there are no transactions in the Link. The latency effect can be further pronounced for applications that include resources that may be moved around multiple server nodes by invoking hot-plug flows between the shared resources and the compute nodes.

This disclosure addresses the latency for link training by performing equalization once and storing the resulting equalization parameter values in a nonvolatile storage. The stored equalization parameter values can be retrieved across multiple boot/power cycles. The equalization and other TX/RX settings can be saved and used in subsequent link reset, platform reset/power cycle to bypass equalization or to reduce latency associated with equalization during link training. Advantages of the present disclosure are readily apparent to those of skill in the art. Among the advantages include a reduction in the link training time in the order of 300-400 ms by loading settings equivalent to a factory settings.

Aspects of this disclosure include performing equalization in each of the data rates above Gen 2 as described in FIG. 2 above, and storing the resulting equalization settings to avoid long latency equalization from that point on. If the devices in the link have not changed, the stored equalization parameter values can be used to link train the links between connected devices in subsequent initialization procedures.

When the link(s) are initialized, the link undergoes an equalization procedure. System software, firmware, and/or hardware can determine if the components of the link can support local save/restore equalization parameters (or this capability can be made mandatory). The system software can instruct the components to store the settings locally. If not, the system software can read out the registers and store it in the system storage. On subsequent link initialization, if the same components are present in the link, the system software can set up the DSP to indicate to the other components to skip equalization and either to restore the settings from their local storage or to load the registers through configuration cycle accesses for the DSP/USP. For retimers, the system can access the configuration space indirectly through the DSP registers.

This disclosure introduces an architected ordered set to access the retimer registers (for both read and write operations) using 8b/10b encoding at the lower data rates. Note that the retimer configuration registers can also be read by the control SKP OS already defined in the specification at Gen 4 or Gen 5 Data Rates. Once all the components have loaded their equalization and other TX/RX settings, the system software can indicate the DSP to change the Data Rate to Gen 3 and above.

Figure 3A:
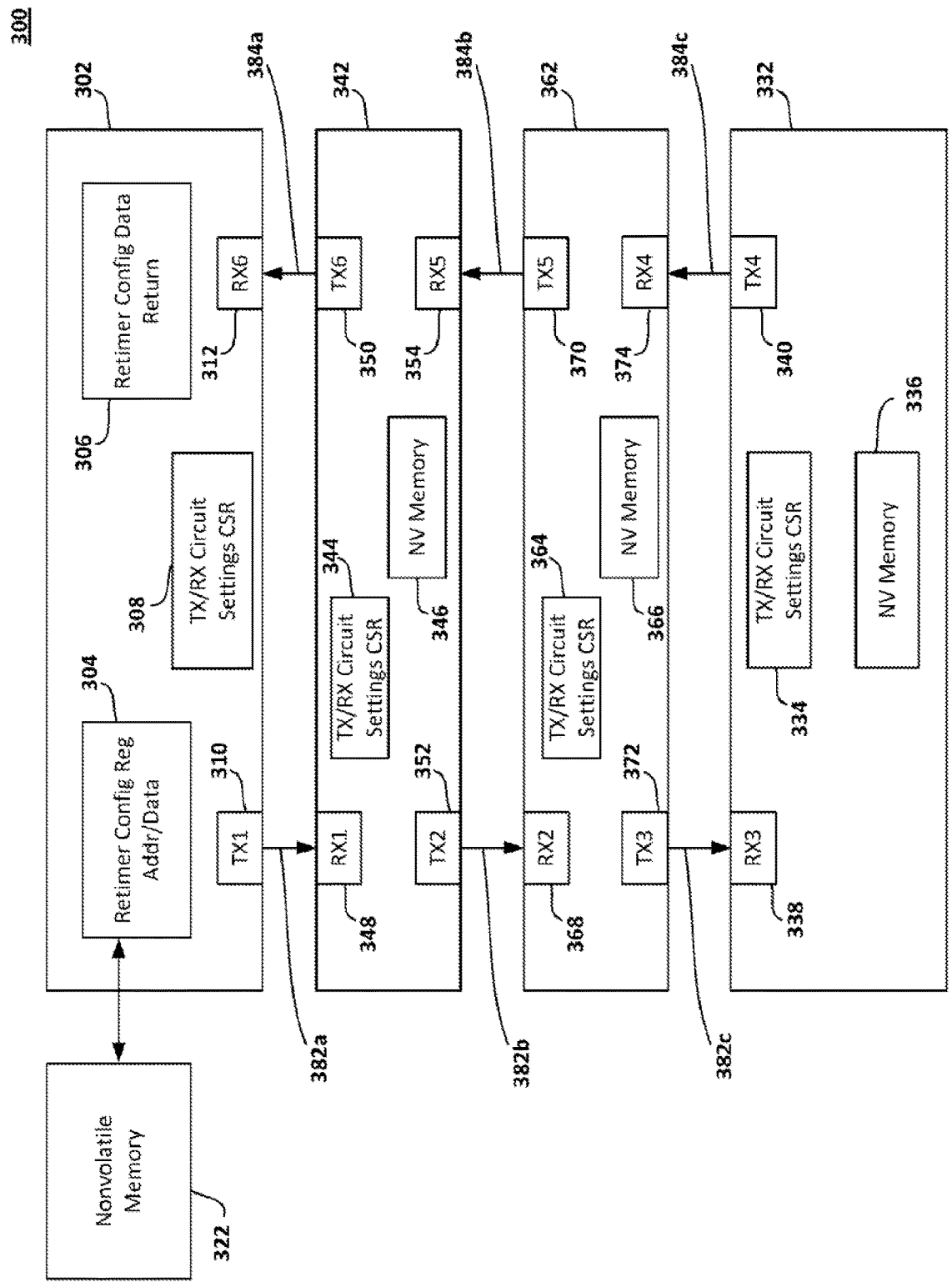
FIG. 3A is a schematic diagram of a system that includes a downstream port (DSP) connected to an upstream port (USP) and two retimers in accordance with embodiments of the present disclosure.

FIG. 3A is a schematic diagram of a system 300 that includes a upstream port (USP) 302 connected to an downstream port (USP) 332 and two retimers in accordance with embodiments of the present disclosure. The USP 302 can be part of a processor of a computing device, such as a central processing unit (CPU) or a PCIe-compliant switch. The USP 302 can be connected to a nonvolatile memory 322. Nonvolatile memory 322 can be a scratch pad memory, flash memory, or other nonvolatile storage. The USP 302 can include a TX/RX circuit settings control status register (CSR) 308. The control status register 308 can include equalization parameter values as register settings for the USP 302, as well as other parameter values that result from link training.

The USP 302 can also include logic to communicate with retimers 342 and 362. For example, the USP 302 can include a retimer configuration register address and data logic 304 and a retimer configuration data return logic 306. The logic can be implemented in software, hardware, or a combination of software and hardware.

The USP 302 also includes a transmitter TX1 310 and a receiver RX6 312. The transmitter TX1 310 can be coupled to a receiver at a downstream connected device. In FIGS.

3A-C, TX1 310 is connected by a link 382a to a receiver RX1 348 that is part of a retimer 342. It is understood, however, that the USP transmitter TX1 308 can be directly coupled to a receiver at a downstream port, such as RX3 338 at DSP 332.

Figure 3B:
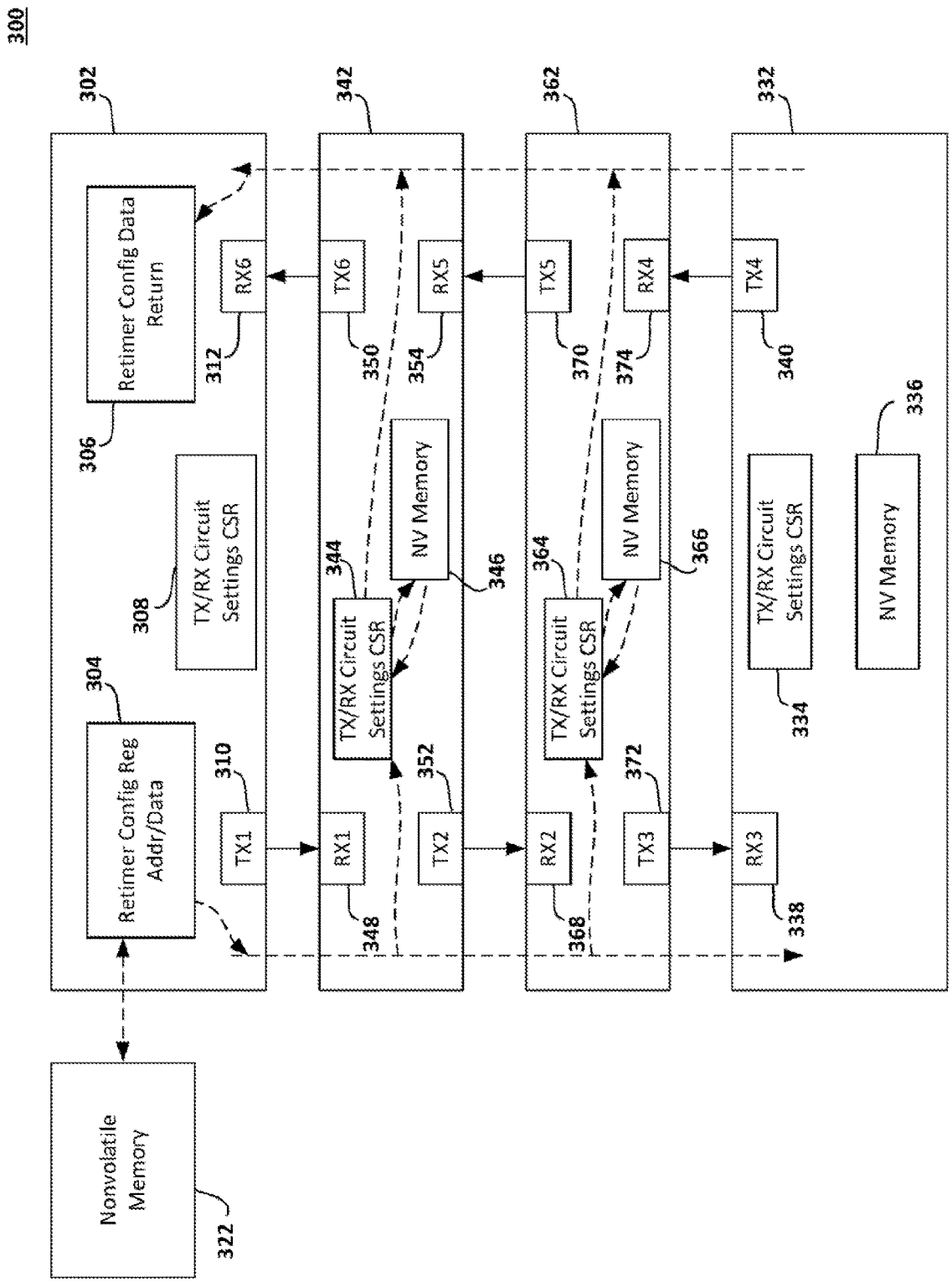
FIG. 3B is a schematic diagram illustrating register read/write access pathways between the downstream port (DSP) and the upstream port (USP) and the two retimers of FIG. 3A in accordance with embodiments of the present disclosure.

Likewise, the USP 302 can include a receiver RX6 312 that is connected to a downstream connected device. In FIGS. 3A-C, RX6 310 is connected by a link 384a to a receiver TX6 350 that is part of retimer 342. It is understood, however, that the USP receiver RX6 310 can be directly coupled to a receiver at a downstream port, such as TX4 340 at DSP 332.

The DSP 332 can include a TX/RX circuit settings CSR 334 that can include equalization parameter values, as well as other parameter values that result from link training. The DSP 332 can also include a receiver RX3 338 connected by a link 382c to a retimer transmitter TX3 372 at retimer 362. Likewise, DSP 332 can also include a transmitter TX4 340 connected by a link 384c to a retimer receiver RX4 372 at retimer 362.

The system 300 is shown to include two retimers connected between the upstream port 302 and the downstream port 332. Though shown as two retimers, it is understood that any number of retimers can be used within the scope of the disclosure, including zero retimers, where the USP 302 is directly connected to the DSP 332.

A first retimer 342 can include a TX/RX circuit settings CSR 344 that can include equalization parameter values, as well as other parameter values that result from link training. The first retimer 342 can also include a receiver RX1 348 connected by a link 382a to a USP transmitter TX1 310 at USP 302. RX1 348 can receive downstream transmissions from USP 302. Likewise, first retimer 342 can also include a transmitter TX2 352 connected by a link 382b to a retimer receiver RX2 368 at a second retimer 362. TX2 352 can transmit downstream towards a DSP 332 via retimer 362.

The first retimer 342 can also include a receiver RX5 354 for receiving upstream transmissions from, e.g., the second retimer 362 across a link 384b. The first retimer 342 can also include a transmitter TX6 350 for upstream transmissions across a link 384a to USP 302.

A second retimer 362 can include a TX/RX circuit settings CSR 364 that can include equalization parameter values, as well as other parameter values that result from link training. The second retimer 362 can also include a receiver RX2 368 connected by a link 382b to a first retimer transmitter TX2 352 at first retimer 342. RX2 368 can receive downstream transmissions from first retimer 342. Likewise, second retimer 362 can also include a transmitter TX3 372 connected by a link 382c to a DSP receiver RX3 338 at DSP 332. TX3 372 can transmit downstream to DSP 332.

The second retimer 362 can also include a receiver RX4 374 for receiving upstream transmissions from, e.g., the DSP 332 across a link 384c. The second retimer 362 can also include a transmitter TX5 370 for upstream transmissions across a link 384b to first retimer 342 (e.g., to RX5 354).

Links 382a-c and links 384a-c can be multi-lane links that are compliant with the PCIe protocol.

In some embodiments, the first retimer 342 can include a local nonvolatile memory 346 for locally storing equalization parameters; the second retimer 362 can include a local nonvolatile memory 366. The local nonvolatile memory can be a scratch pad type of memory that can store equalization parameter values and other link training values for loading during a subsequent initialization of the connected devices.

FIG. 3B is a schematic diagram illustrating register read/write access pathways between the upstream port (USP) and the downstream port (DSP) and the two retimers of FIG. 3A in accordance with embodiments of the present disclosure. In some embodiments, the USP 302 can be directly connected to the DSP 332 without using retimers. In such embodiments, the USP 302 can communicate directly with the DSP 332. For example, after the equalization sequence described in FIG. 2 is performed, the USP 302 can read the equalization parameters from the TX/RX circuit settings CSR 334 and store the equalization parameters directly in nonvolatile memory 322. Upon re-initialization of the system components, the USP 302 can retrieve the equalization parameter values for the DSP 332 from the nonvolatile memory 322 and write the equalization parameter values for the DSP 332 directly to the TX/RX circuit settings CSR 334.

In embodiments that include the use of retimers between the USP 302 and the DSP 332, the USP cannot directly read or write to the CSR within the retimers because the CSR are physical layer entities. Therefore, this disclosure describes a mechanism by which the USP 302 can communicate indirectly with each retimer using physical layer commands to read and write the equalization parameter values to the retimer CSRs (CSR 344 or CSR 364, respectively).

Figure 4A:
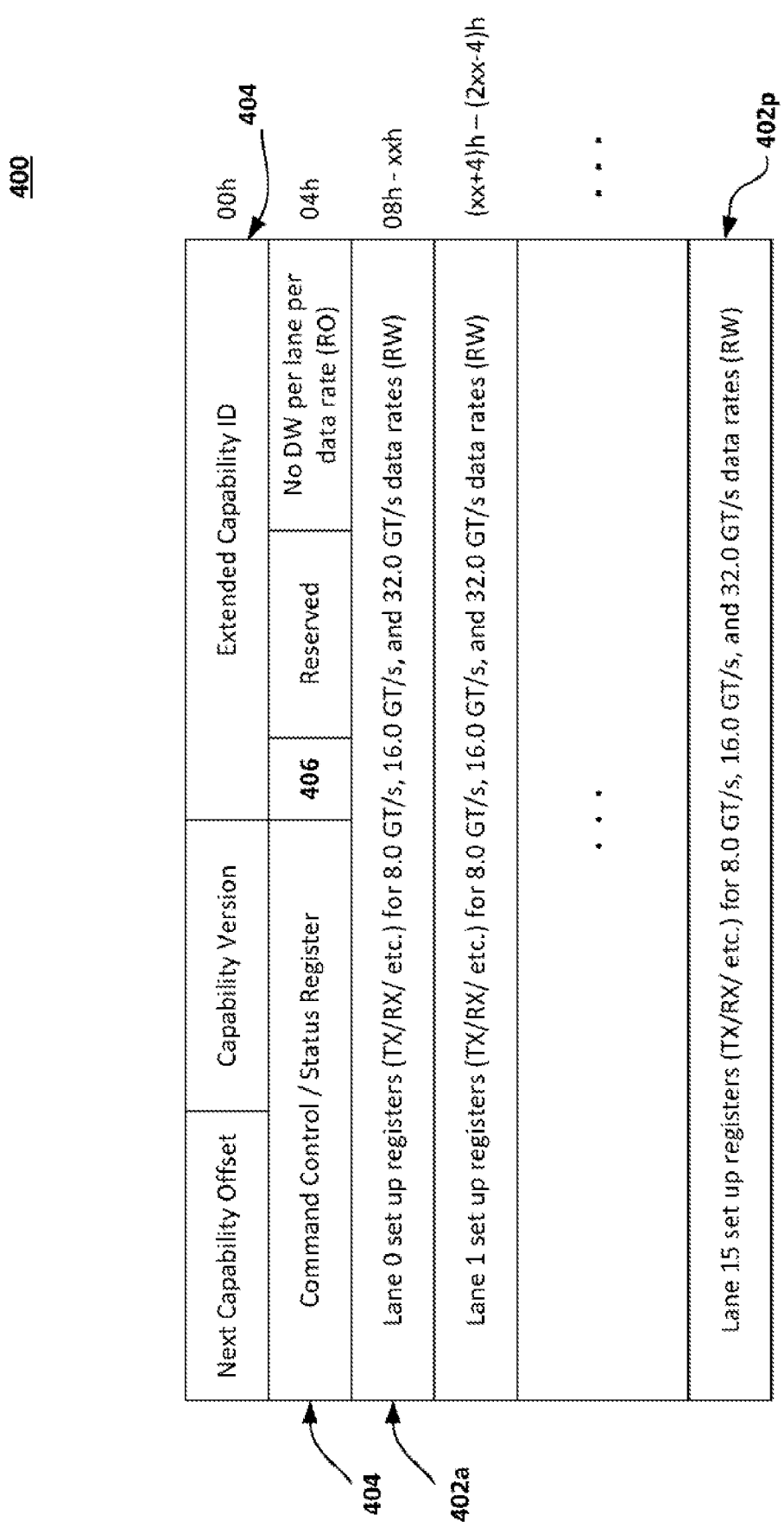
FIGS. 4A-C are schematic diagrams of an architected capability structure and register structure for equalization and other transmission and reception circuit settings in accordance with embodiments of the present disclosure.
Figure 4B:
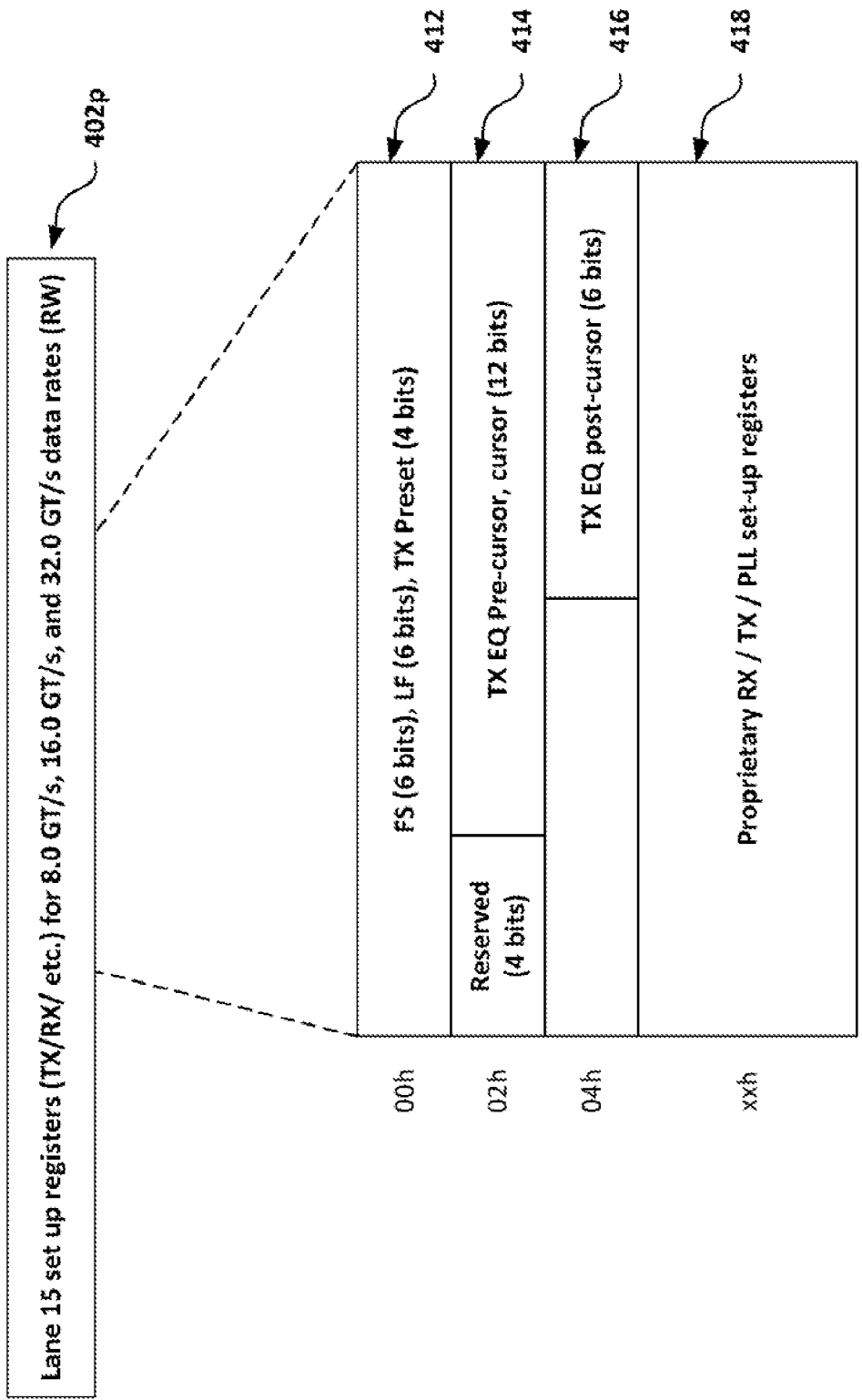
Figure 4C:
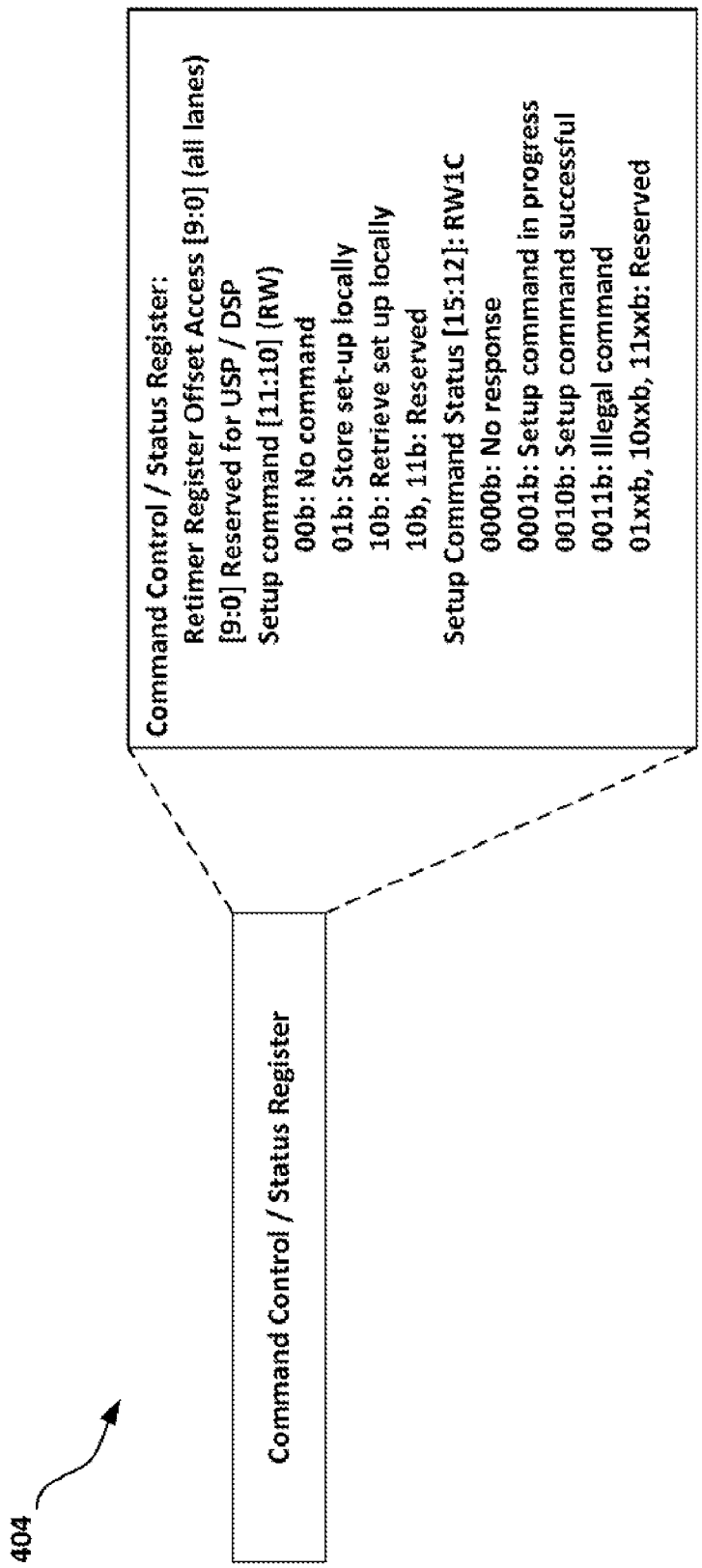

Each component of the system 300 (e.g., USP 302, DSP 332, retimer(s) 342 and 362, etc.) can include a set of architected registers (e.g., CSR 308, 344, 364, and 334) that capture the equalization settings, as well as other Transmitter (TX) and Receiver (RX) settings, on a per-lane basis. FIGS. 4A-C illustrate the capability structure for hosting these registers.

FIGS. 4A-C are schematic diagrams of an architected capability structure and register structure 400 for equalization and other transmission and reception circuit settings in accordance with embodiments of the present disclosure. The architected capability structure 400 can include a plurality of bit fields, including a plurality of set-up bit fields that include lane-specific set-up registers (e.g., bit fields 402a-p). The plurality of set-up bit fields includes a bit field for each lane of the link; in this example, the link includes 16 lanes, including lane 0.

Each component may have a local persistent storage (e.g., flash, or other nonvolatile memory 346 or 366 in FIGS. 3A-B) where the retimers can save/restore these registers locally. The architected capability structure can include a set bit 404 that can indicate the presence or absence of a local nonvolatile memory in the retimer and/or the downstream device. If such a local store is not available, system software can read the contents of these registers and store it in its persistent storage (e.g., flash, disk, other nonvolatile memory 322) after the first equalization and use the stored values on subsequent equalizations. The registers in the retimers 342 and 362 can be accessed through a set of architected registers, as shown in FIGS. 3A-B as CSR 344 and 364, respectively.

FIG. 4B illustrates an example set-up bit field 402p for lane 15 of the link. The set-up bit field 402p includes equalization parameter values representative of an equalization procedure performed on the link and for the specific lane (here, lane 15). The equalization parameter values included in the set-up bit field include TX EQ pre-cursor and cursor bits (414), TX EQ post-cursor bits (416), and proprietary RX/TX/PLL set-up registers (418). The set-up bit field can also include FS, LF, and TX Preset bits (412). These bit fields (i.e., the FS, LF, and TX Preset bits)

characterize the set-up of the transmitter design, including the fine-grain control it has, as architected in the PCIe specification. The FS and LF bits indicate the range of finer-grain coefficients with which the receiver can operate the transmitter. The TX Preset field indicates which of the architected 11 preset fields the TX needs to start with if the RX needs to perform equalization using coefficients. Some reserved bits are also included, which can be used for additional functionality at a later time.

In addition to the TX preset, FS, LF, pre-cursor, post-cursor, and cursor values used in the equalization process, the system described herein also permits each design to have implementation specific registers (such as parameters for various control loops, CTLE/DFE settings, etc.) mapped into the configuration space. Thus, a variable "Number of DWs per Lane per Data Rate" can be defined, which indicates to software the number of double words (DWs) it needs to save/restore for that component. The retimer registers are accessed through a windowing mechanism using bits[9:0] at offset 06h through the DSP CSRs. For local save/restore as well as other commands, there are command (bits 11:10)/response (bits 15:12) handshake register bits in offset 06h. Table 1 illustrates an example ordered set for retimer register read/writes. The ordered set can access retimer registers using 8b/10b encoding at the lower data rates. The retimer configuration registers can also be read by the control SKP OS already defined in the specification at Gen 4 or Gen 5 Data Rates. Once all the components have loaded their equalization and other TX/RX settings, the system software can indicate the DSP to change the Data Rate to Gen 3 and above Each component in the link advertises its ability to bypass equalization by setting a previously Reserved bit (e.g., Bit 6 of Symbol 5, a Training Control symbol renamed herein as "Highest Data Rate Equalization only") in Training Sets (TS1 and TS2). If any retimer in a topology (such as the one shown in FIGS. 3A-B) does not support the ability to bypass EQ, the retimer resets the 'Highest Data Rate Equalization only' bit to 0b. Thus, by the time the link is trained to L0 for the first time, all components know whether the components of the linked system have the ability to participate in the mechanism to save and restore the equalization settings to bypass equalization.

The architected capability structure 400 also includes a command control/status register bit field 404. FIG. 4C illustrates the command control/status register bit field 404.

TABLE 1

Ordered Set for Retimer Register Read/Write

| Symbol No. | Description | |
| --- | --- | --- |
| 0 | K28.4: Start of Control/Status Ordered Set | |
| 1 | Cmd/Resp[3:0]:<br>0000b: NOP<br>0001b: Load EQ<br>0010b: Load EQ Response<br>0011b: Vendor Defined<br>(Vendor ID in symbols 2, 3)<br>0100b-1111b: Reserved<br>Rcvr No[3:0]<br>Only retimer receivers target on load EQ | Cmd/Resp[3:0]:<br>0000b: NOP<br>0001b: Load EQ<br>0010b: Load EQ Response<br>0011b: Vendor Defined<br>(Vendor ID in symbols 2, 3)<br>0100b-1111b: Reserved<br>Rcvr No[3:0]: Broadcast used for Load EQ Response |
| 2 | If Cmd/Resp = Load EQ:<br>8B Addr Offset (32 bit) | RX (B) 8B Addr Offset [7:0]: 00 h default |
| 3 | | RX (C) 8B Addr Offset [7:0]: 00 h default |
| 4 | | RX (D) 8B Addr Offset [7:0]: 00 h default |
| 5 | | RX (E) 8B Addr Offset [7:0]: 00 h default |
| 6-13 | If Cmd/Resp = Load EQ: 64 bit value | Reserved |
| 14-15 | {2'b00, Per-symbol parity for symbols 13:1, 1'b0} | {2'b00, Per-symbol parity for symbols} |

Returning to FIG. 3B, the upstream port 302 can include software and/or hardware that can send commands downstream to the downstream port 322 and to the retimers 342 and 362. After link training and equalization, the retimer config reg addr/data logic 304 can use the ordered set or a variant of the ordered set of Table 1 to request that the retimer 342 read equalization parameter values from the TX/RX circuit settings CSR 344. The retimer 342 can send the equalization parameter values to the upstream port 302 to a retimer config data return logic 306. The upstream port 302 can store the equalization parameter values in nonvolatile memory 322. Similarly, the retimer config reg addr/data logic 304 can use the ordered set or a variant of the ordered set of Table 1 to request that the retimer 362 read equalization parameter values from the TX/RX circuit settings CSR 364. The retimer 362 can send the equalization parameter values to the upstream port 302 to a retimer config data return logic 306. The upstream port 302 can store the equalization parameter values in nonvolatile memory 322. Note that the Ordered Set defined in Table 1 can be sent even when the Link is operating with transactions in the L0 state to ensure that equalization settings save/restore can occur on an operational link.

For a subsequent link training (e.g., for a re-initialization of the system), the retimer config reg addr/data logic 304 can use the ordered set or a variant of the ordered set of Table 1 to write equalization parameters values stored in nonvolatile memory 322 to the TX/RX circuit settings CSR 344 of the retimer 342. Similarly, the retimer config reg addr/data logic 304 can use the ordered set or a variant of the ordered set of Table 1 to write equalization parameters values stored in nonvolatile memory 322 to the TX/RX circuit settings CSR 364 of the retimer 362.

In embodiments, the retimer 342 can include a nonvolatile memory 346. The retimer 342 can be instructed to store the equalization parameter values in the nonvolatile memory 346 instead of or in addition to the nonvolatile memory 322. The retimer config reg addr/data logic 304 can instruct the retimer 342 to write the equalization parameter values stored in local nonvolatile memory 346 to the TX/RX circuit settings CSR 344. Similarly, the retimer 362 can include a nonvolatile memory 366. The retimer 362 can be instructed to store the equalization parameter values in the nonvolatile memory 366 instead of or in addition to the nonvolatile memory 322. The retimer config reg addr/data logic 304 can instruct the retimer 362 to write the equalization parameter values stored in local nonvolatile memory 366 to the TX/RX circuit settings CSR 364.

To perform the retimer register accesses, the USP 302 sends a physical layer command through the retimer config reg logic 304 that goes to the retimer. The register access command can include a read (or write) request to a specific register(s) of the TX/RX circuit settings CSR inside a Retimer. The USP 302 uses Ordered Sets (such as the one starting with K28.4 defined above for 8b/10b or a Control SKP Ordered set in 128b/130b encoding) to convey this command to retimer(s). The response from the retimer(s) 342 and/or 362 is carried back in an Ordered Set flowing in the Upstream direction and recorded in the retimer config data return logic 306. System software can then read and store the values from the registers to the nonvolatile memory 322 on a read or use it as indication of completion on a write.

As mentioned previously, the upstream port 302 can include logic to read the equalization parameter values from the TX/RX circuit settings CSR 334 in the DSP 332, and can store the equalization parameter values from the DSP 332 to the nonvolatile memory 322. The USP 302 can write the equalization parameter values from the nonvolatile memory 322 to the DSP TX/RX circuit settings CSR 334 during a re-initialization link training equalization process. The USP 302 can also store the equalization parameter values for itself in the nonvolatile memory 322, and can use the equalization parameter values stored in the nonvolatile memory 322 during a re-initialization link training equalization process.

The use of stored equalization parameter values allows the system to skip equalization processes during subsequent link trainings. Or, the system can use the equalization parameter values from a previous link training as a starting point for a subsequent equalization process to reduce the latency time associated with a full equalization process for link training.

Figure 5A:
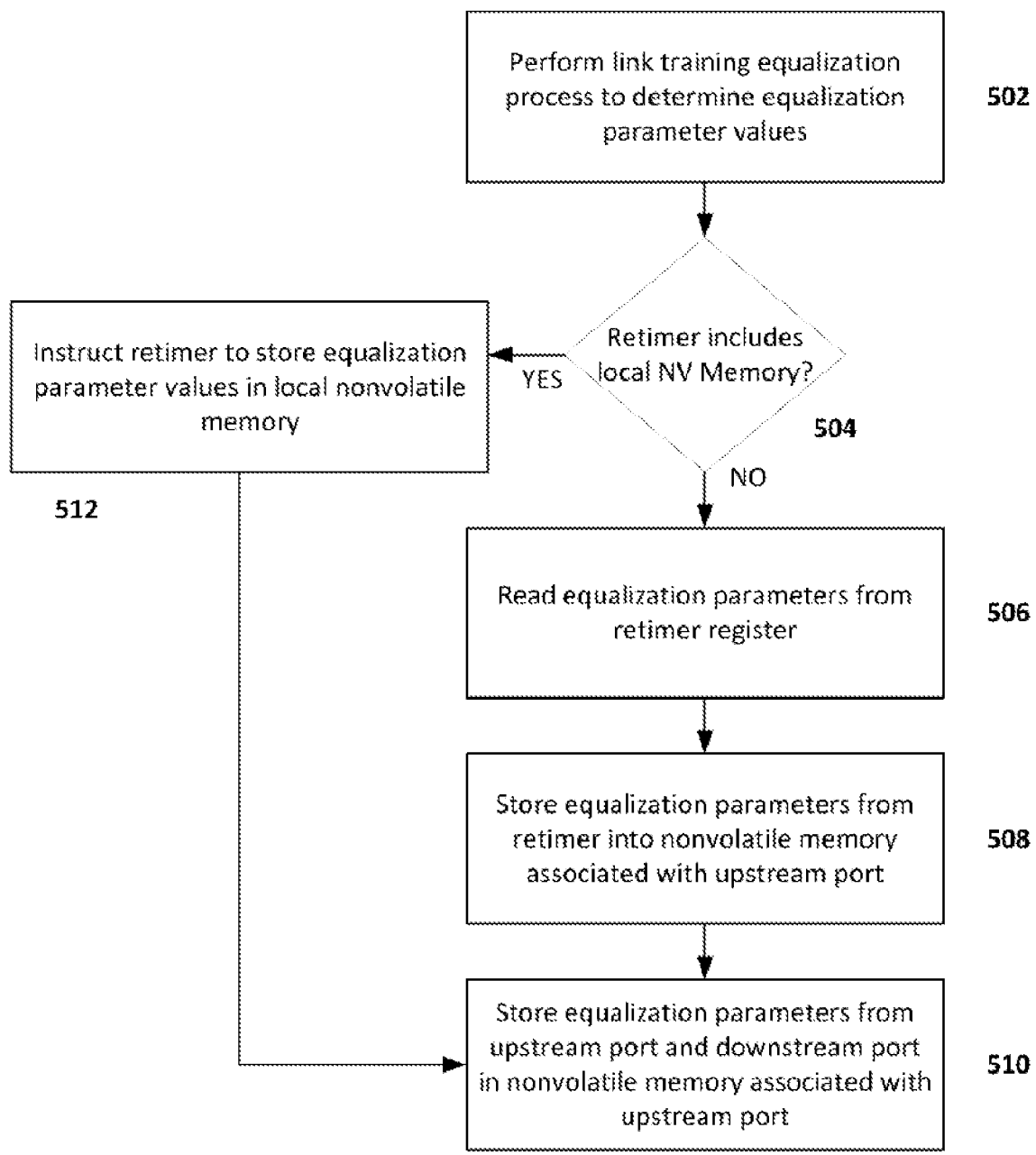
FIG. 5A is a process flow diagram for performing link training including equalization in accordance with embodiments of the present disclosure.

FIG. 5 is a process flow diagram 500 for performing link training including equalization in accordance with embodiments of the present disclosure. The process flow diagram 500 can be performed, for example, at a manufacturer site or for the initial set up of the linked components. At the outset, an upstream port (USP) and a downstream port (DSP) coupled to each other by one or more PCIe compliant links can undergo a link training, which can including an equalization procedure to determine one or more equalization parameter values (502). One or more retimers can be coupled to the transmitter and receiver (e.g., linked between the transmitter and receiver), and the links coupling the retimers can also undergo link training and equalization procedures. The upstream port can include logic to retrieve and store equalization parameter values from components coupled to the upstream port across the PCIe compliant link, such as the downstream port (510). The upstream port can store the equalization parameter values in a nonvolatile memory coupled to or associated with the upstream port.

In some embodiments, the USP can include logic to determine whether each retimer includes a local nonvolatile memory (504). For example, the USP logic can receive a data structure that includes a set bit indicating the presence or absence of a nonvolatile memory local to the retimer(s). The upstream port can include logic implemented in hardware, software, or a combination of hardware and software.

If the retimer does not include a local nonvolatile memory, the upstream port logic can read equalization parameter values from the retimer settings register (506). For example, the upstream port logic can cause the retimer settings register to provide the contents of one or more specified registers that contain equalization parameter values. The upstream port logic can store the equalization parameter values in a nonvolatile memory coupled to the upstream port (or associated with the upstream port) (508).

If the retimer does include a local nonvolatile memory, the upstream port logic can instruct the retimer to store equalization parameter values in local nonvolatile memory (512). In embodiments, the retimer can automatically store equalization parameter values in the local nonvolatile memory to the retimer. The equalization parameter values for the upstream port and the downstream port can be stored in the nonvolatile memory associated with the upstream port (510).

Figure 5B:
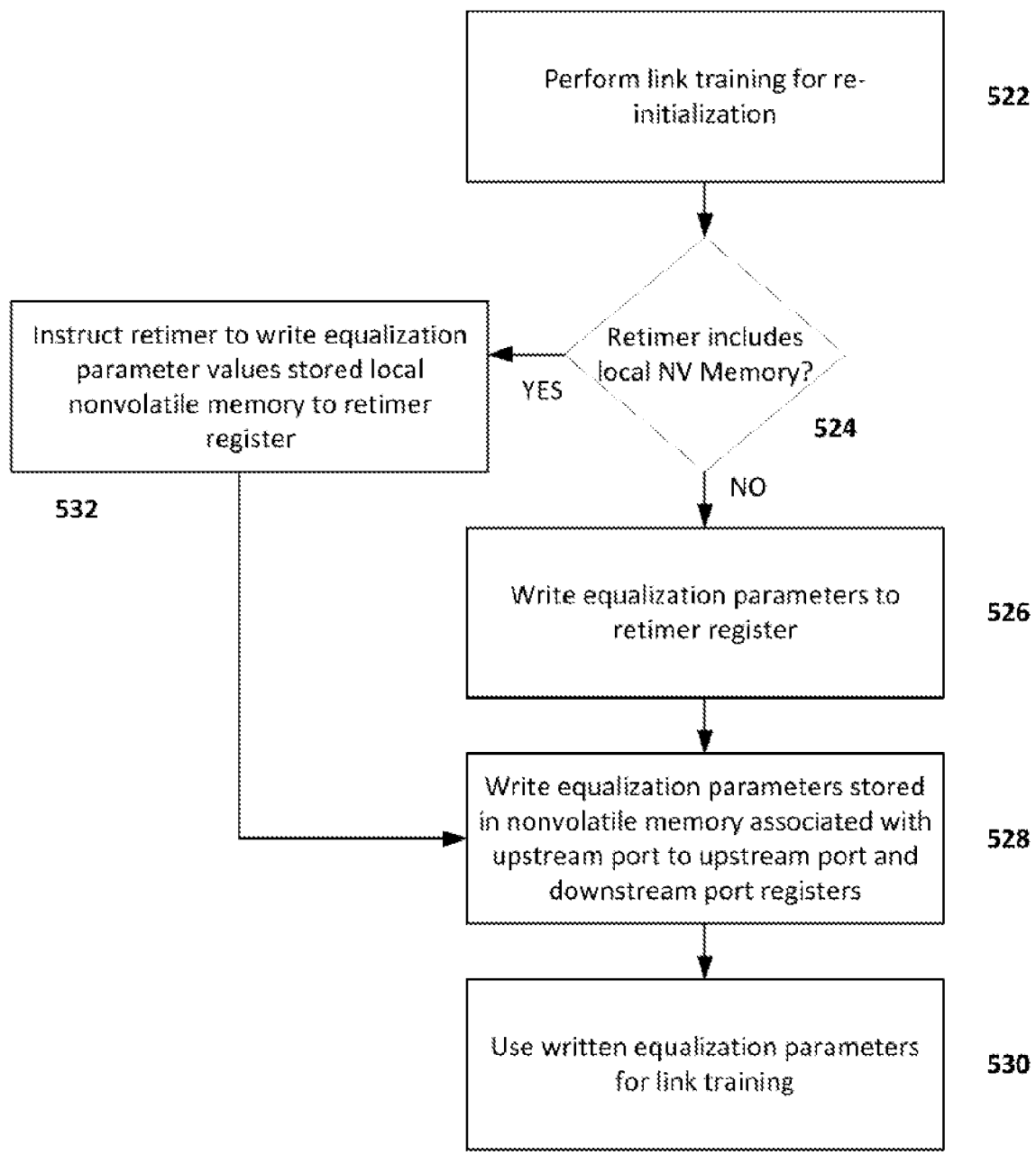
FIG. 5B is a process flow diagram for loading equalization and other parameters for link training in accordance with embodiments of the present disclosure.

FIG. 5B is a process flow diagram 520 for loading equalization and other parameters for link training in accordance with embodiments of the present disclosure. The process flow diagram 520 can be performed after the linked components (e.g., upstream port, downstream port, and any retimers) are re-initialized. As part of a re-initialization process, the system can undergo link training. For re-initialization, however, the link training can forgo the equalization process and can use stored values of equalization parameter values.

The upstream port can include logic implemented in hardware, software, or a combination of hardware and software. The upstream port logic can write equalization parameter values to a register of the upstream port and a register of the downstream port (528). The system can use the equalization parameter values to conclude link training (530).

In embodiments, the upstream port logic can determine whether one or more retimers coupled to the upstream port and/or the downstream port across one or more PCIe links includes a local nonvolatile memory (524). If the retimer includes a local nonvolatile memory, then the upstream port logic can instruct retimer to write equalization parameter values stored local nonvolatile memory to retimer register.

In embodiments, the upstream port logic can determine that the retimer(s) do not include a local nonvolatile memory. The upstream port logic can write equalization parameters to the retimer register(s) (526).

Figure 6A:
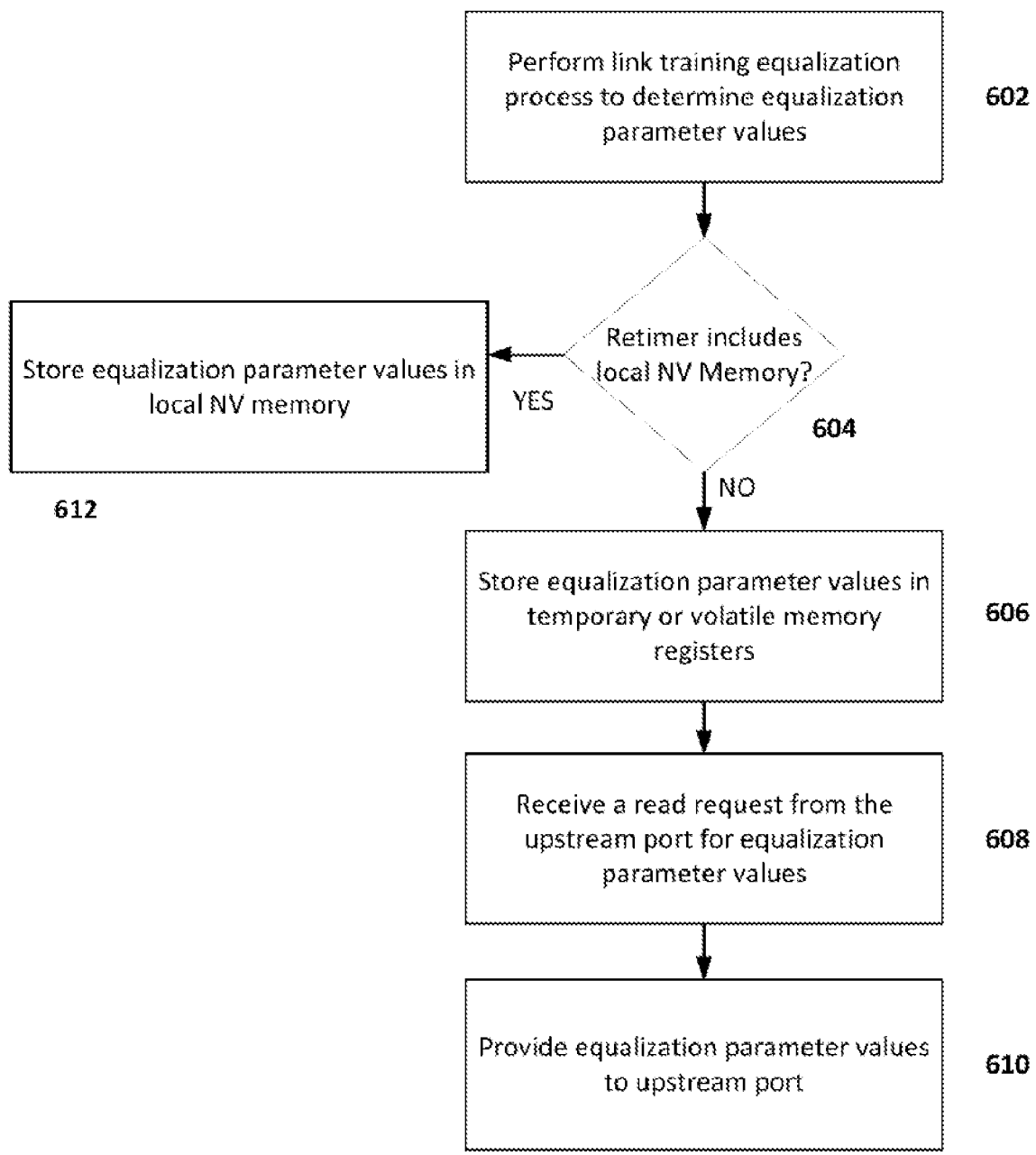
FIG. 6A is a process flow diagram for a retimer for storing equalization parameter values in accordance with embodiments of the present disclosure.

FIG. 6A is a process flow diagram 600 for a retimer for storing equalization parameter values in accordance with embodiments of the present disclosure. The retimer can undergo an initial link training, which includes an equalization process to determine one or more equalization parameter values (602). If the retimer includes a local nonvolatile memory (604), then the retimer can store the equalization parameter values in the local nonvolatile memory (612).

If the retimer does not include a local nonvolatile memory, then the retimer can temporarily store the equalization parameter values in a settings register of the retimer (606). The retimer can receive a read request from an upstream port for reading the equalization parameter values stored in the settings register (608). The retimer can read the equalization parameter values and provide the equalization parameter values to the upstream port for storage (610).

Figure 6B:
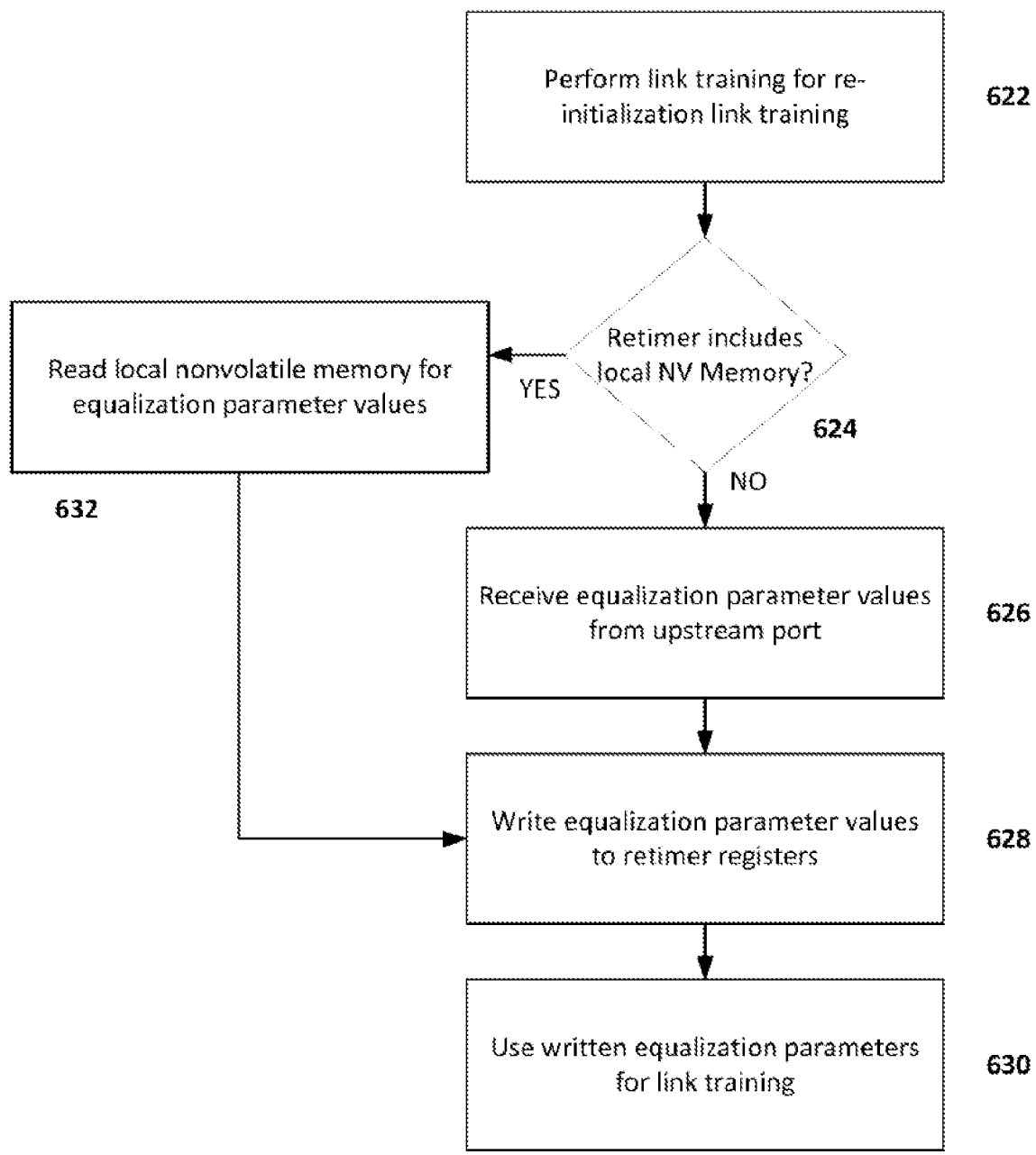
FIG. 6B is a process flow diagram for writing equalization parameter values into a retimer register in accordance with embodiments of the present disclosure.

FIG. 6B is a process flow diagram 620 for writing equalization parameter values into a retimer register in accordance with embodiments of the present disclosure. The retimer can undergo a link training as part of a re-initialization of the connected system. If the retimer includes a local nonvolatile memory (624), then the retimer can read the equalization parameter values from the local nonvolatile memory and write the equalization parameter values into the retimer settings register (628). If the retimer does not include a local nonvolatile memory, then the retimer can receive from an upstream port one or more equalization parameter values stored in a nonvolatile memory associated with the upstream port (626). The retimer can write the equalization parameter values into the setting register (628). The system can use the equalization parameter values for link training, as opposed to performing a sequential equalization procedure for each data rate (630).

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCIe is a high performance, general purpose I/O interconnect protocol defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot- Swap support, Data Integrity, and Error Handling are among some of the advanced features supported by PCI Express.

Figure 7:
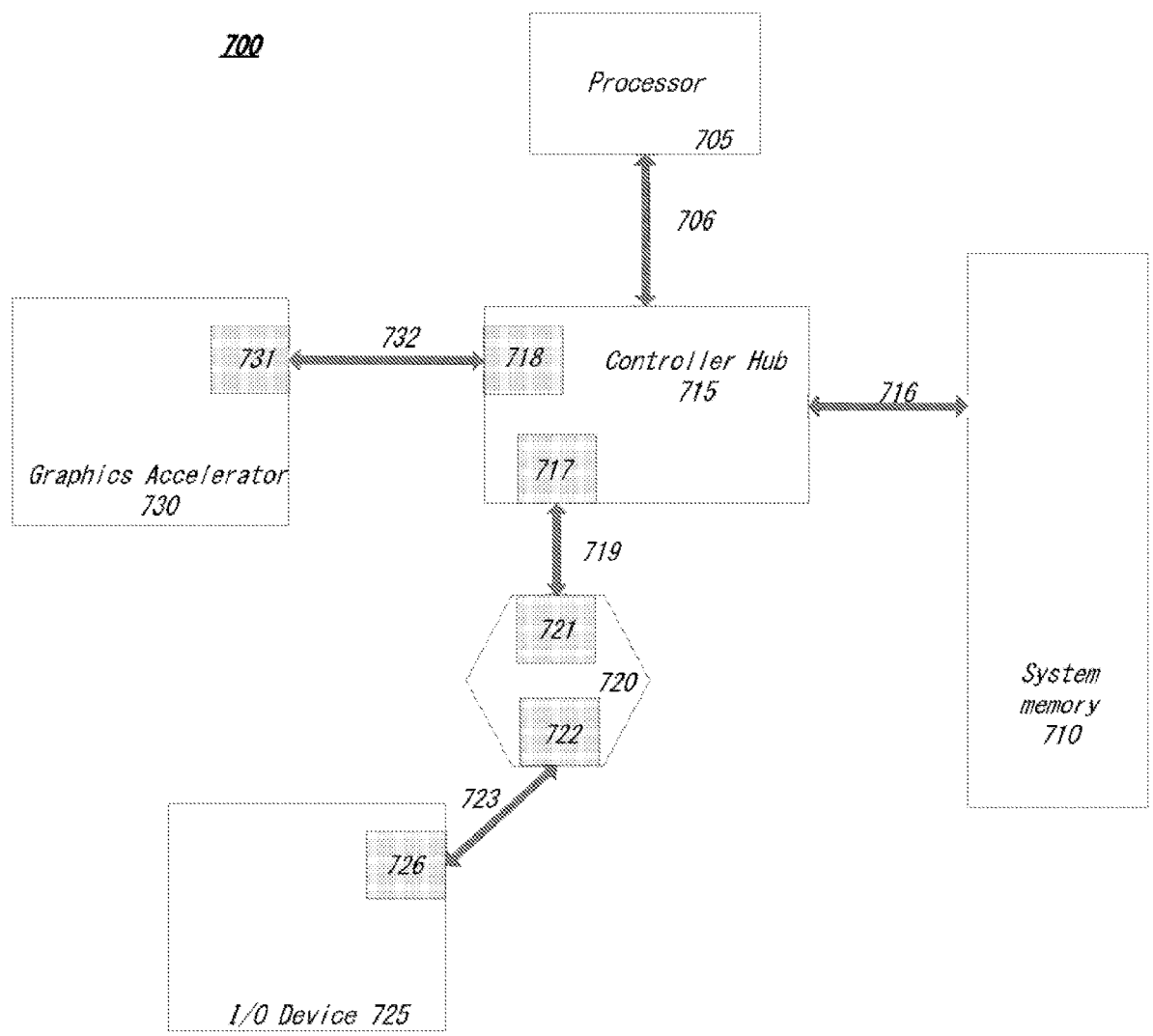
FIG. 7 illustrates an embodiment of a computing system including an interconnect architecture.

Referring to FIG. 7, an embodiment of a fabric composed of point-to-point Links that interconnect a set of components is illustrated. System 700 includes processor 705 and system memory 710 coupled to controller hub 715. Processor 705 includes any processing element, such as a microprocessor, a host processor, an embedded processor, a co-processor, or other processor. Processor 705 is coupled to controller hub 715 through front-side bus (FSB) 706. In one embodiment, FSB 706 is a serial point-to-point interconnect as described below. In another embodiment, link 706 includes a serial, differential interconnect architecture that is compliant with different interconnect standard.

System memory 710 includes any memory device, such as random access memory (RAM), nonvolatile (NV) memory, or other memory accessible by devices in system 700. System memory 710 is coupled to controller hub 715 through memory interface 716. Examples of a memory interface include a double-data rate (DDR) memory interface, a dual-channel DDR memory interface, and a dynamic RAM (DRAM) memory interface.

In one embodiment, controller hub 715 is a root hub, root complex, or root controller in a Peripheral Component Interconnect Express (PCIe or PCIE) interconnection hierarchy. Examples of controller hub 715 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 705, while controller 715 is to communicate with I/O devices, in a similar manner as described below. In some embodiments, peer-to-peer routing is optionally supported through root complex 715.

Here, controller hub 715 is coupled to switch/bridge 720 through serial link 719. Input/output modules 717 and 721, which may also be referred to as interfaces/ports 717 and 721, include/implement a layered protocol stack to provide communication between controller hub 715 and switch 720. In one embodiment, multiple devices are capable of being coupled to switch 720.

Switch/bridge 720 routes packets/messages from device 725 upstream, i.e. up a hierarchy towards a root complex, to controller hub 715 and downstream, i.e. down a hierarchy away from a root controller, from processor 705 or system memory 710 to device 725. Switch 720, in one embodiment, is referred to as a logical assembly of multiple virtual PCI-to-PCI bridge devices. Device 725 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 725 may include a PCIe to PCI/PCI-X bridge to support legacy or other version PCI devices. Endpoint devices in PCIe are often classified as legacy, PCIe, or root complex integrated endpoints.

Graphics accelerator 730 is also coupled to controller hub 715 through serial link 732. In one embodiment, graphics accelerator 730 is coupled to an MCH, which is coupled to an ICH. Switch 720, and accordingly I/O device 725, is then coupled to the ICH. I/O modules 731 and 718 are also to implement a layered protocol stack to communicate between graphics accelerator 730 and controller hub 715. Similar to the MCH discussion above, a graphics controller or the graphics accelerator 730 itself may be integrated in processor 705.

Figure 8:
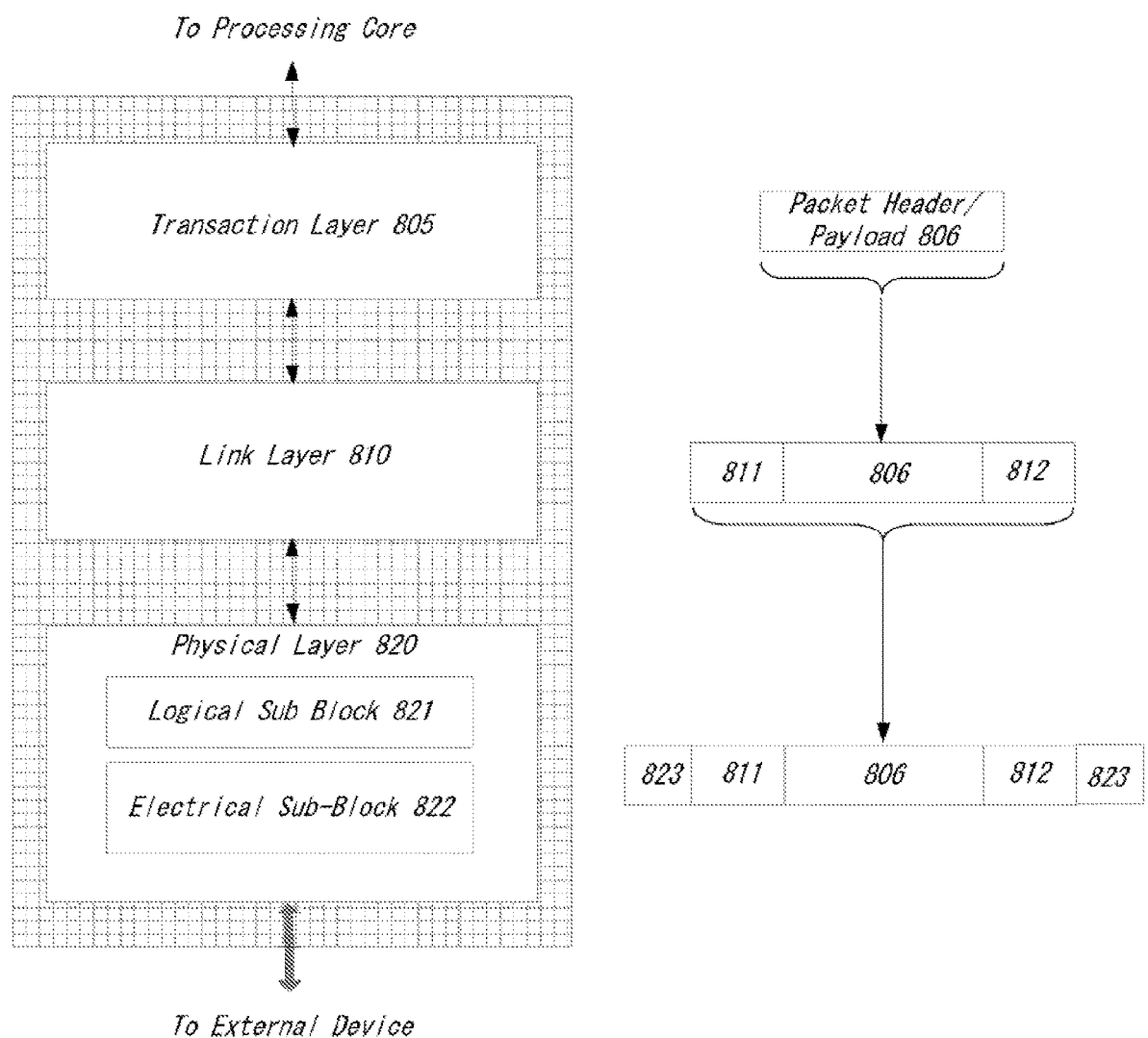
FIG. 8 illustrates an embodiment of a interconnect architecture including a layered stack.
Figure 9:
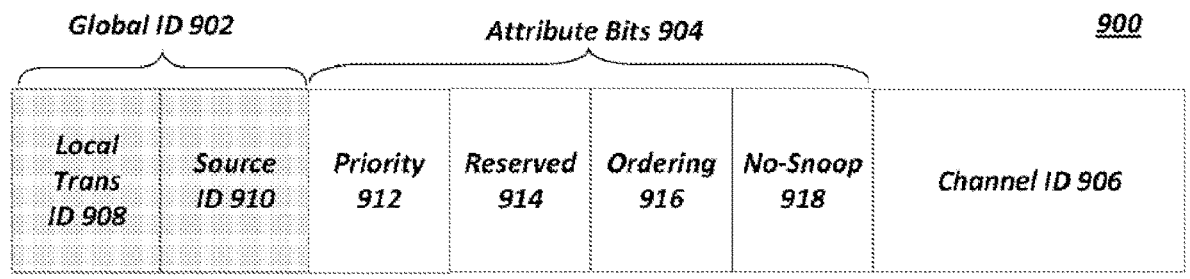
FIG. 9 illustrates an embodiment of a request or packet to be generated or received within an interconnect architecture.

Turning to FIG. 8 an embodiment of a layered protocol stack is illustrated. Layered protocol stack 800 includes any form of a layered communication stack, such as a Quick Path Interconnect (QPI) stack, a PCIe stack, a next generation high performance computing interconnect stack, or other layered stack. Although the discussion immediately below in reference to FIGS. 7-9 are in relation to a PCIe stack, the same concepts may be applied to other interconnect stacks. In one embodiment, protocol stack 800 is a PCIe protocol stack including transaction layer 805, link layer 810, and physical layer 820. An interface, such as interfaces 717, 718, 721, 722, 726, and 731 in FIG. 7, may be represented as communication protocol stack 800. Representation as a communication protocol stack may also be referred to as a module or interface implementing/including a protocol stack.

PCI Express uses packets to communicate information between components. Packets are formed in the Transaction Layer 805 and Data Link Layer 810 to carry the information from the transmitting component to the receiving component. As the transmitted packets flow through the other layers, they are extended with additional information necessary to handle packets at those layers. At the receiving side the reverse process occurs and packets get transformed from their Physical Layer 820 representation to the Data Link Layer 810 representation and finally (for Transaction Layer Packets) to the form that can be processed by the Transaction Layer 1005 of the receiving device.

Transaction Layer

In one embodiment, transaction layer 805 is to provide an interface between a device's processing core and the interconnect architecture, such as data link layer 810 and physical layer 820. In this regard, a primary responsibility of the transaction layer 805 is the assembly and disassembly of packets (i.e., transaction layer packets, or TLPs). The translation layer 805 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 805. An external device at the opposite end of the link, such as controller hub 715 in FIG. 7, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 805 assembles packet header/payload 806. Format for current packet headers/payloads may be found in the PCIe specification at the PCIe specification website.

Referring briefly to FIG. 9, an embodiment of a PCIe transaction descriptor is illustrated. In one embodiment, transaction descriptor 900 is a mechanism for carrying transaction information. In this regard, transaction descriptor 900 supports identification of transactions in a system. Other potential uses include tracking modifications of default transaction ordering and association of transaction with channels.

Transaction descriptor 900 includes global identifier field 902, attributes field 1004 and channel identifier field 906. In the illustrated example, global identifier field 902 is depicted comprising local transaction identifier field 908 and source identifier field 910. In one embodiment, global transaction identifier 902 is unique for all outstanding requests.

According to one implementation, local transaction identifier field 908 is a field generated by a requesting agent, and it is unique for all outstanding requests that require a completion for that requesting agent. Furthermore, in this example, source identifier 910 uniquely identifies the requestor agent within a PCIe hierarchy. Accordingly, together with source ID 910, local transaction identifier 908 field provides global identification of a transaction within a hierarchy domain.

Attributes field 904 specifies characteristics and relationships of the transaction. In this regard, attributes field 904 is potentially used to provide additional information that allows modification of the default handling of transactions. In one embodiment, attributes field 904 includes priority field 912, reserved field 914, ordering field 916, and no-snoop field 918. Here, priority sub-field 912 may be modified by an initiator to assign a priority to the transaction. Reserved attribute field 914 is left reserved for future, or vendor-defined usage. Possible usage models using priority or security attributes may be implemented using the reserved attribute field.

In this example, ordering attribute field 916 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 1118 is utilized to determine if transactions are snooped. As shown, channel ID Field 906 identifies a channel that a transaction is associated with.

Link Layer

Link layer 810, also referred to as data link layer 810, acts as an intermediate stage between transaction layer 905 and the physical layer 820. In one embodiment, a responsibility of the data link layer 810 is providing a reliable mechanism for exchanging Transaction Layer Packets (TLPs) between two components a link. One side of the Data Link Layer 810 accepts TLPs assembled by the Transaction Layer 805, applies packet sequence identifier 811, i.e. an identification number or packet number, calculates and applies an error detection code, i.e. CRC 812, and submits the modified TLPs to the Physical Layer 820 for transmission across a physical to an external device.

Physical Layer

In one embodiment, physical layer 820 includes logical sub block 821 and electrical sub-block 822 to physically transmit a packet to an external device. Here, logical sub-block 821 is responsible for the "digital" functions of Physical Layer 821. In this regard, the logical sub-block includes a transmit section to prepare outgoing information for transmission by physical sub-block 822, and a receiver section to identify and prepare received information before passing it to the Link Layer 810.

Physical block 822 includes a transmitter and a receiver. The transmitter is supplied by logical sub-block 821 with symbols, which the transmitter serializes and transmits onto to an external device. The receiver is supplied with serialized symbols from an external device and transforms the received signals into a bit-stream. The bit-stream is de-serialized and supplied to logical sub-block 821. In one embodiment, an 8b/10b transmission code is employed, where ten-bit symbols are transmitted/received. Here, special symbols are used to frame a packet with frames 823. In addition, in one example, the receiver also provides a symbol clock recovered from the incoming serial stream.

As stated above, although transaction layer 805, link layer 810, and physical layer 820 are discussed in reference to a specific embodiment of a PCIe protocol stack, a layered protocol stack is not so limited. In fact, any layered protocol may be included/implemented. As an example, an port/ interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 10:
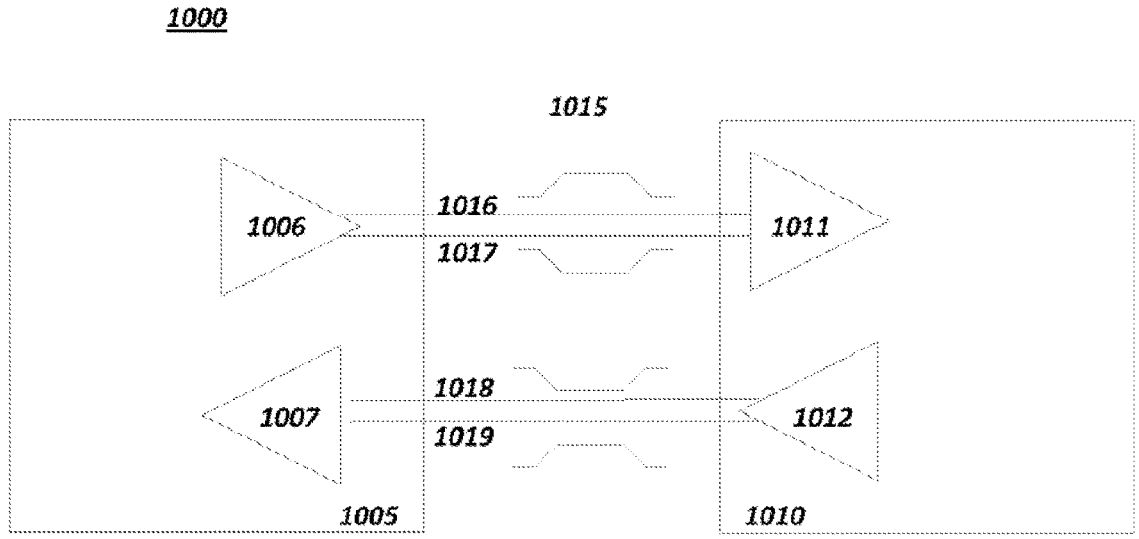
FIG. 10 illustrates an embodiment of a transmitter and receiver pair for an interconnect architecture.

Referring next to FIG. 10, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 1006/1011 and a receive pair 1012/1007. Accordingly, device 1005 includes transmission logic 1006 to transmit data to device 1010 and receiving logic 1007 to receive data from device 1010. In other words, two transmitting paths, i.e. paths 1016 and 1017, and two receiving paths, i.e. paths 1018 and 1019, are included in a PCIe link.

A transmission path refers to any path for transmitting data, such as a transmission line, a copper line, an optical line, a wireless communication channel, an infrared communication link, or other communication path. A connection between two devices, such as device 1005 and device 1010, is referred to as a link, such as link 1015. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 1016 and 1017, to transmit differential signals. As an example, when line 1016 toggles from a low voltage level to a high voltage level, i.e. a rising edge, line 1017 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Figure 11:
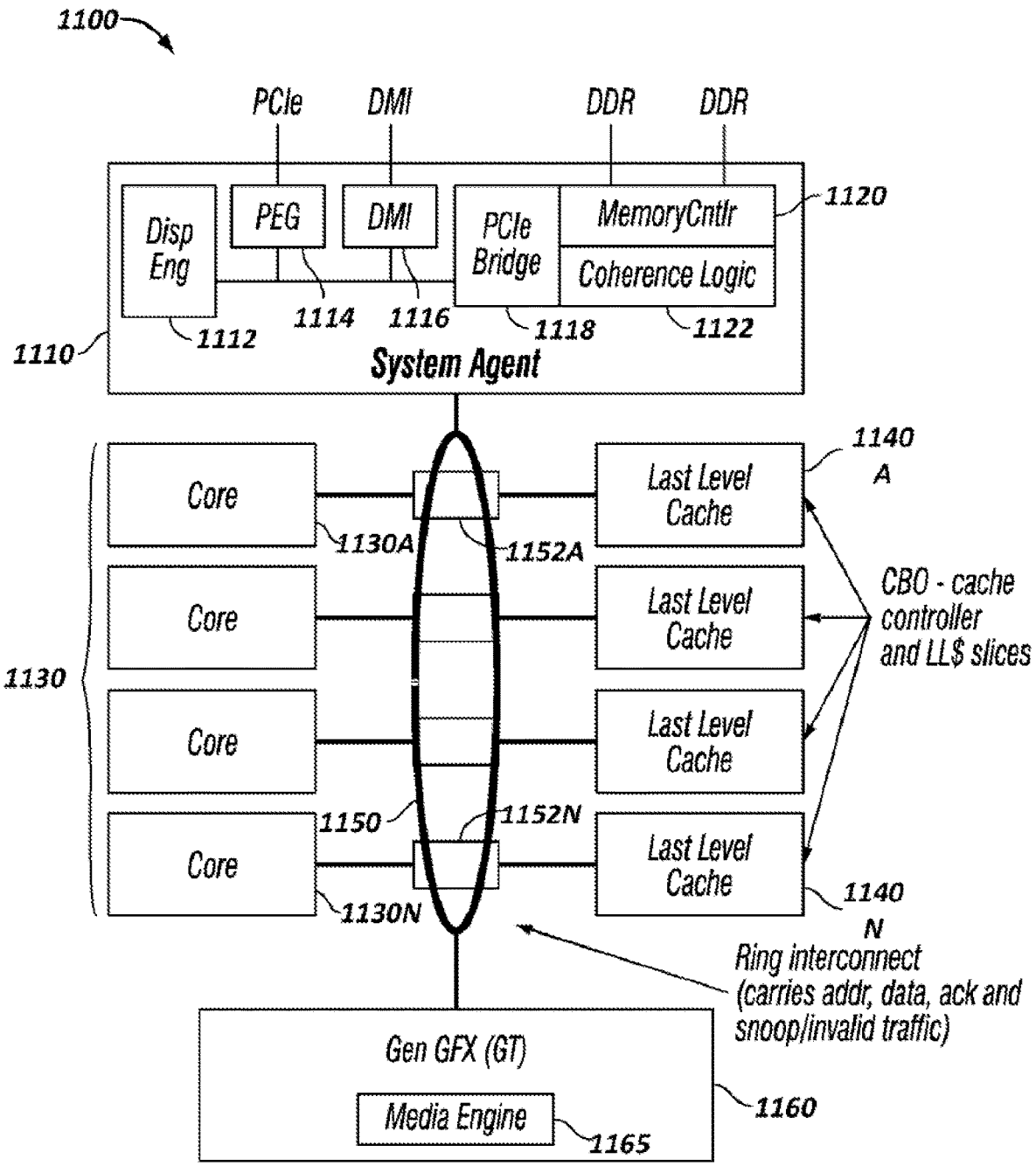
FIG. 11 illustrates an example multicore processor in accordance with embodiments of the present disclosure.

Referring now to FIG. 11, shown is a block diagram of an embodiment of a multicore processor. As shown in the embodiment of FIG. 11, processor 1300 includes multiple domains. Specifically, a core domain 1130 includes a plurality of cores 1130A-1130N, a graphics domain 1160 includes one or more graphics engines having a media engine 1165, and a system agent domain 1110.

In various embodiments, system agent domain 1110 handles power control events and power management, such that individual units of domains 1130 and 1160 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 1130 and 1160 may operate at different voltage and/or power, and furthermore the individual units within the domains each potentially operate at an independent frequency and voltage. Note that while only shown with three domains, understand the scope of the present disclosure is not limited in this regard and additional domains may be present in other embodiments.

As shown, each core 1130 further includes low level caches in addition to various execution units and additional processing elements. Here, the various cores are coupled to each other and to a shared cache memory that is formed of a plurality of units or slices of a last level cache (LLC) 1140A-1140N; these LLCs often include storage and cache controller functionality and are shared amongst the cores, as well as potentially among the graphics engine too.

As seen, a ring interconnect 1150 couples the cores together, and provides interconnection between the core domain 1130, graphics domain 1160 and system agent circuitry 1110, via a plurality of ring stops 1152A-1152N, each at a coupling between a core and LLC slice. As seen in FIG. 11, interconnect 1150 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, Intel On-chip System Fabric (IOSF), an Advanced Microcontroller Bus Architecture (AMBA) interconnect, a multi-dimensional mesh fabric, or other known interconnect architecture) may be utilized in a similar fashion.

As further depicted, system agent domain 1110 includes display engine 1112 which is to provide control of and an interface to an associated display. System agent domain 1110 may include other units, such as: an integrated memory controller 1120 that provides for an interface to a system memory (e.g., a DRAM implemented with multiple DIMMs; coherence logic 1122 to perform memory coherence operations. Multiple interfaces may be present to enable interconnection between the processor and other circuitry. For example, in one embodiment at least one direct media interface (DMI) 1116 interface is provided as well as one or more PCIe™ interfaces 1114. The display engine and these interfaces typically couple to memory via a PCIe™ bridge 1118. Still further, to provide for communications between other agents, such as additional processors or other circuitry, one or more other interfaces (e.g. an Intel® Quick Path Interconnect (QPI) fabric) may be provided.

Figure 12:
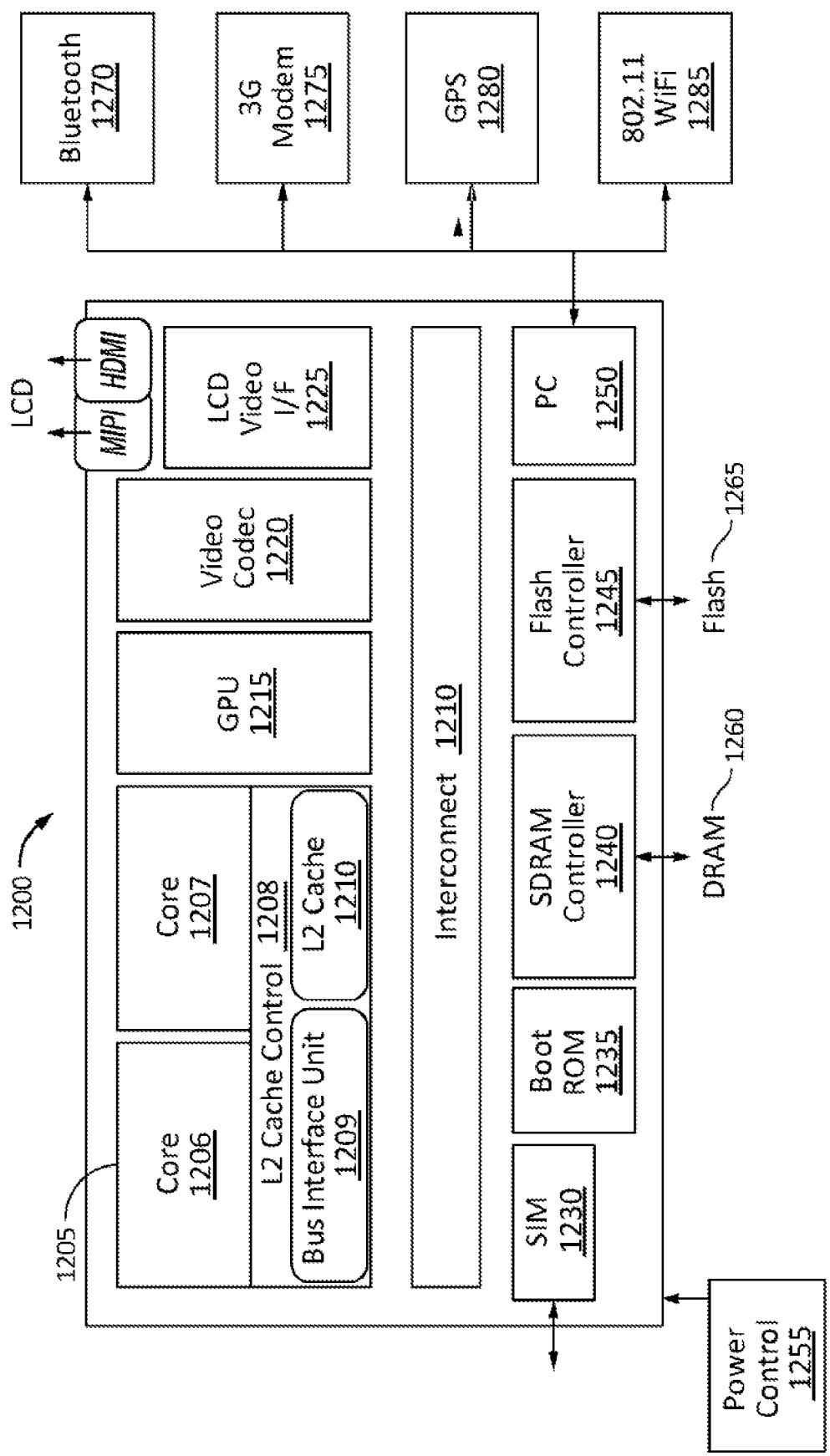
FIG. 12 illustrates another embodiment of a block diagram for a computing system.

Turning next to FIG. 12, an embodiment of a system on-chip (SOC) design in accordance with the disclosures is depicted. As a specific illustrative example, SOC 1200 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1200 includes 2 cores-1206 and 1207. Similar to the discussion above, cores 1206 and 1207 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1206 and 1207 are coupled to cache control 1208 that is associated with bus interface unit 1209 and L2 cache 1210 to communicate with other parts of system 1200. Interconnect 1210 includes an on-chip interconnect, such as an IOSF, AMBA, or other interconnect discussed above, which potentially implements one or more aspects of the described disclosure.

Interface 1210 provides communication channels to the other components, such as a Subscriber Identity Module (SIM) 1230 to interface with a SIM card, a boot ROM 1235 to hold boot code for execution by cores 1206 and 1207 to initialize and boot SOC 1200, a SDRAM controller 1240 to interface with external memory (e.g. DRAM 1260), a flash controller 1245 to interface with nonvolatile memory (e.g.

Flash 1265), a peripheral control 1250 (e.g. Serial Peripheral Interface) to interface with peripherals, video codecs 1220 and Video interface 1225 to display and receive input (e.g. touch enabled input), GPU 1215 to perform graphics related computations, etc. Any of these interfaces may incorporate aspects of the disclosure described herein.

In addition, the system illustrates peripherals for communication, such as a Bluetooth module 1270, 3G modem 1275, GPS 1285, and Wi-Fi 1285. Note as stated above, a UE includes a radio for communication. As a result, these peripheral communication modules are not all required. However, in a UE some form a radio for external communication is to be included.

Figure 13:
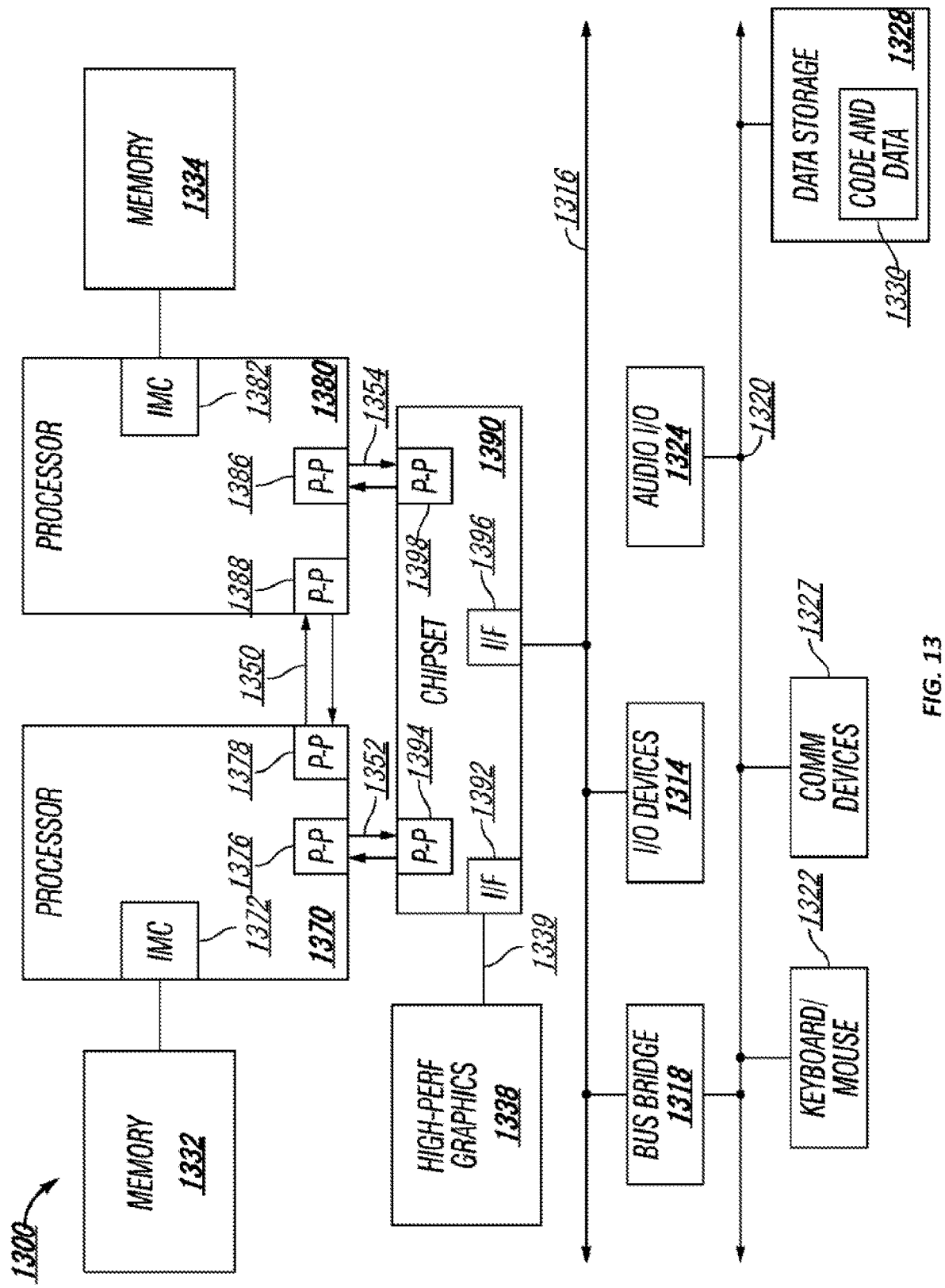
FIG. 13 illustrates an embodiment of a block for a computing system including multiple processor sockets.

Referring now to FIG. 13, shown is a block diagram of a second system 1300 in accordance with an embodiment of the present disclosure. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of a processor. In one embodiment, 1352 and 1354 are part of a serial, point-to-point coherent interconnect fabric, such as Intel's Quick Path Interconnect (QPI) architecture. As a result, the disclosure may be implemented within the QPI architecture.

While shown with only two processors 1370, 1380, it is to be understood that the scope of the present disclosure is not so limited. In other embodiments, one or more additional processors may be present in a given processor.

Processors 1370 and 1380 are shown including integrated memory controller units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 each exchange information with a chipset 1390 via individual P-P interfaces 1352, 1354 using point to point interface circuits 1376, 1394, 1386, 1398. Chipset 1390 also exchanges information with a high-performance graphics circuit 1338 via an interface circuit 1392 along a high-performance graphics interconnect 1339.

A shared cache (not shown) may be included in either processor or outside of both processors; yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present disclosure is not so limited.

As shown in FIG. 13, various I/O devices 1314 are coupled to first bus 1316, along with a bus bridge 1318 which couples first bus 1316 to a second bus 1320. In one embodiment, second bus 1320 includes a low pin count (LPC) bus. Various devices are coupled to second bus 1320 including, for example, a keyboard and/or mouse 1322, communication devices 1327 and a storage unit 1328 such as a disk drive or other mass storage device which often includes instructions/code and data 1330, in one embodiment. Further, an audio I/O 1324 is shown coupled to second bus 1320. Note that other architectures are possible, where the included components and interconnect architectures vary. For example, instead of the point-to-point architecture of FIG. 13, a system may implement a multi-drop bus or other such architecture.

Figure 14:
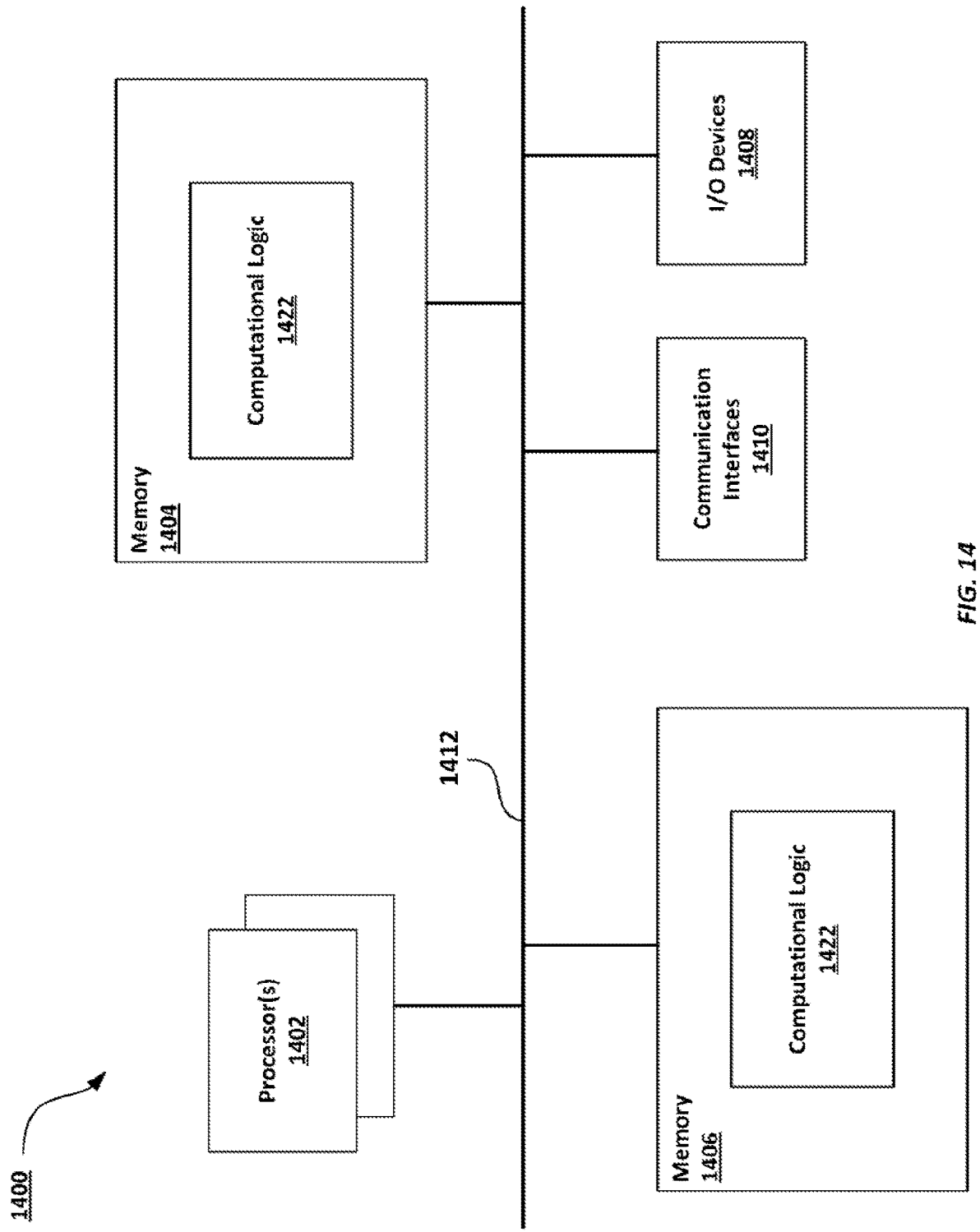
FIG. 14 illustrates an example computing device that may include and/or be suitable for use with various components described herein.

FIG. 14 illustrates an example computing device 1400 that may include and/or be suitable for use with various components described herein. As shown, computing device 1400 may include one or more processors or processor cores 1402 and system memory 1404. For the purpose of this application, including the claims, the terms "processor" and "processor cores" may be considered synonymous, unless the context clearly requires otherwise. The processor 1402 may include any type of processors, such as a central processing unit (CPU), a microprocessor, and the like. The processor 1402 may be implemented as an integrated circuit having multi-cores, e.g., a multi-core microprocessor. The computing device 1400 may include mass storage devices 1406 (such as diskette, hard drive, volatile memory (e.g., dynamic random access memory (DRAM), compact disc read-only memory (CD-ROM), digital versatile disk (DVD), and so forth). In general, system memory 1404 and/or mass storage devices 1406 may be temporal and/or persistent storage of any type, including, but not limited to, volatile and nonvolatile memory, optical, magnetic, and/or solid state mass storage, and so forth. Volatile memory may include, but is not limited to, static and/or dynamic random access memory. Nonvolatile memory may include, but is not limited to, electrically erasable programmable read-only memory, phase change memory, resistive memory, and so forth. The processor(s) 1402, mass storage 1406 and/or system memory 1404 may together or separately be considered to be, or implement, the BIOS and/or EC in whole or in part.

The computing device 1400 may further include I/O devices 1408 (such as a display (e.g., a touchscreen display), keyboard, cursor control, remote control, gaming controller, image capture device, and so forth) and communication interfaces 1410 (such as network interface cards, modems, infrared receivers, radio receivers (e.g., Bluetooth), and so forth). In some embodiments the I/O devices 1408 may be coupled with the other components of the computing device 1400 via a PCI-e4 connection as described herein.

The communication interfaces 1410 may include communication chips (not shown) that may be configured to operate the device 1400 in accordance with a Global System for Mobile Communication (GSM), General Packet Radio Service (GPRS), Universal Mobile Telecommunications System (UMTS), High Speed Packet Access (HSPA), Evolved HSPA (EHSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1410 may operate in accordance with other wireless protocols in other embodiments. In some embodiments, the communication interfaces 1410 may be, may include, and/or may be coupled with the EC and/or TCPM as described herein.

The above-described computing device 1400 elements may be coupled to each other via system bus 1412, which may represent one or more buses. In the case of multiple buses, they may be bridged by one or more bus bridges (not shown). Each of these elements may perform its conventional functions known in the art. In particular, system memory 1404 and mass storage devices 1406 may be employed to store a working copy and a permanent copy of the programming instructions for the operation of various components of computing device 1400, including but not limited to an operating system of computing device 1400 and/or one or more applications. The various elements may be implemented by assembler instructions supported by processor(s) 1402 or high-level languages that may be compiled into such instructions.

The permanent copy of the programming instructions may be placed into mass storage devices 1406 in the factory, or in the field through, for example, a distribution medium (not shown), such as a compact disc (CD), or through communication interface 1410 (from a distribution server (not shown)). That is, one or more distribution media having an implementation of the agent program may be employed to distribute the agent and to program various computing devices.

The number, capability, and/or capacity of the elements 1408, 1410, 1412 may vary, depending on whether computing device 1400 is used as a stationary computing device, such as a set-top box or desktop computer, or a mobile computing device, such as a tablet computing device, laptop computer, game console, or smartphone. Their constitutions are otherwise known, and accordingly will not be further described.

In embodiments, memory 1404 may include computational logic 1422 configured to implement various firmware and/or software services associated with operations of the computing device 1400. For some embodiments, at least one of processors 1402 may be packaged together with computational logic 1422 configured to practice aspects of embodiments described herein to form a System in Package (SiP) or a System on Chip (SoC).

In various implementations, the computing device 1400 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1400 may be any other electronic device that processes data.

Figure 15:
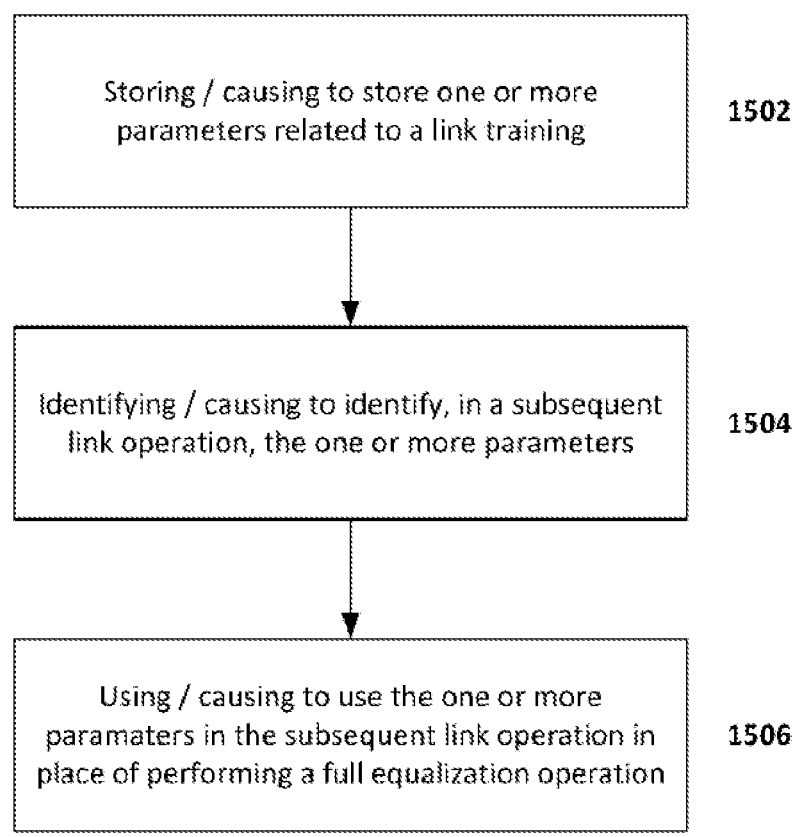
FIG. 15 is a process flow diagram for using stored equalization parameters for link training in accordance with embodiments of the present disclosure.

FIG. 15 is a process flow diagram for using stored equalization parameters for link training in accordance with embodiments of the present disclosure. In some embodiments, the electronic device(s), network(s), system(s), chip(s) or component(s), or portions or implementations thereof, of Figures herein may be configured to perform one or more processes, techniques, or methods as described herein, or portions thereof.

One such process is depicted in FIG. 15. For example, the process may include storing or causing to store one or more parameters related to a link training (1502); identifying or causing to identify, in a subsequent link operation, the one or more parameters (1504); and using or causing to use the one or more parameters in the subsequent link operation in place of performing a subsequent full equalization for link training (1506).

Note that the apparatuses, methods, and systems described above may be implemented in any electronic device or system as aforementioned. As specific illustrations, the figures below provide exemplary systems for utilizing the disclosure as described herein. As the systems below are described in more detail, a number of different interconnects are disclosed, described, and revisited from the discussion above. And as is readily apparent, the advances described above may be applied to any of those interconnects, fabrics, or architectures.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

The following paragraphs provide examples of various ones of the embodiments disclosed herein.

Example 1 is a method for performing link training for one or more input/output links interconnecting an upstream port with a downstream port, the method including storing one or more equalization parameter values for the downstream port in a nonvolatile memory associated with the upstream port; performing a initialization sequence of the one or more input/output links between the upstream port and the downstream port, the initialization sequence comprising link training the one or more input/output links; retrieving the stored equalization parameter values for the downstream port from the nonvolatile memory; writing the stored equalization parameter values for the downstream port to a register associated with the downstream port; and using the equalization parameter values as equalization parameters for the downstream port for operating the one or more links interconnecting the upstream port with the downstream port.

Example 2 may include the subject matter of example 1, and can also include storing one or more equalization parameter values for the upstream port in the nonvolatile memory; retrieving the stored equalization parameter values for the upstream port from the nonvolatile memory; writing the stored equalization parameter values for the upstream port to a register associated with the upstream port; and using the equalization parameter values as equalization parameters for the upstream port for operating the one or more links interconnecting the upstream port with the downstream port.

Example 3 may include the subject matter of example 1, and can also include providing a read request for a register associated with a retimer connected to one or both of the upstream port or the downstream port by one or more links; receiving, from the register associated with the retimer, one or more equalization parameter values for the retimer; and storing the one or more equalization parameter values for the retimer in the nonvolatile memory.

Example 4 may include the subject matter of example 3, and can also include retrieving, from the nonvolatile memory, the stored equalization parameter values for the retimer; writing the stored equalization parameter values for the retimer to the register associated with the retimer; and using the equalization parameter values as equalization parameters for the retimer for operating one or more links interconnecting the retimer to the upstream port or one or more links interconnecting the retimer to the downstream port.

Example 5 may include the subject matter of example 3, wherein providing a read request to the register associated with the retimer comprises providing an ordered set to the register specifying one or more registers from which the retimer is to provide values to the upstream port.

Example 6 may include the subject matter of any of examples 1-3, and can also include determining that a retimer connected to one or both of the upstream port or the downstream port by one or more links comprises a nonvolatile memory local to the retimer; and providing an instruction to the retimer to store one or more equalization parameter values associated with the retimer in the nonvolatile memory local to the retimer.

Example 7 may include the subject matter of example 6, and can also include instructing the retimer to write the equalization parameter values from the nonvolatile memory local to the retimer to a register associated with the retimer; and using the equalization parameter values in the register associated with the retimer as equalization parameters for the retimer for operating one or more links interconnecting the retimer to the upstream port or one or more links interconnecting the retimer to the downstream.

Example 8 may include the subject matter of any of examples 1-7, wherein the input/output links are compliant with a Peripheral Component Interconnect Express (PCIe) protocol.

Example 9 may include the subject matter of any of examples 1-8, wherein using the equalization parameter values as equalization parameters for the downstream port for operating the one or more links interconnecting the upstream port with the downstream port comprises bypassing an equalization procedure of a link training of the one or more links interconnecting the upstream port with the downstream port.

Example 10 may include the subject matter of any of examples 1-9, wherein using the equalization parameter values as equalization parameters for the downstream port for operating the one or more links interconnecting the upstream port with the downstream port comprises using the equalization parameters in the register associated with the downstream port as an initial value for performing an equalization procedure of a link training of the one or more links interconnecting the upstream port with the downstream port.

Example 11 is a system that includes an upstream port; a downstream port coupled to the upstream port by one or more links compliant with a Peripheral Component Interconnect Express (PCIe) protocol, the downstream port comprising a transmission/reception settings register; a nonvolatile memory associated with the upstream port; the upstream port comprising upstream port logic to read equalization parameter values from the downstream port; store the equalization parameter values in the nonvolatile memory associated with the upstream port; write equalization parameter values from the nonvolatile memory to the transmission/reception settings register of the downstream port; and use the equalization parameter values to operate the one or more links.

Example 12 may include the subject matter of example 11, and can also include a retimer coupled to the upstream port by one or more links compliant with the PCIe protocol, the retimer residing upstream of the downstream port, the retimer comprising a retimer settings register; the upstream port comprising logic to provide a read access request to the retimer settings register; receive equalization parameter values from the retimer settings register; and store the equalization parameter values in the nonvolatile memory.

Example 13 may include the subject matter of example 12, the upstream port comprising logic to provide a write access request to the retimer setting register to write the equalization parameter values to a specified register address.

Example 14 may include the subject matter of any of examples 11-13, and can also include a retimer coupled to the upstream port by one or more links compliant with the PCIe protocol, the retimer residing upstream of the downstream port, the retimer comprising a settings register; the upstream port comprising logic to determine that the retimer comprises a nonvolatile memory local to the retimer; and provide an instruction to the retimer to store equalization parameter values to the nonvolatile memory local to the retimer.

Example 15 may include the subject matter of example 14, the upstream port further comprising logic to provide a write instruction to the retimer to write the equalization parameter values from the nonvolatile memory local to the retimer settings register; and use the equalization parameter values written to the retimer register to operate the one or more links interconnecting the retimer with the upstream port.

Example 16 may include the subject matter of any of examples 11-15, wherein the upstream port logic comprises a retimer configuration register logic implemented at least partially in hardware and a retimer configuration data return logic implemented at least partially in hardware.

Example 17 may include the subject matter of any of examples 11-16, wherein the transmission/reception settings register of the downstream port comprises a command/status register.

Example 18 may include the subject matter of any of examples 11-17, wherein the nonvolatile memory comprises a flash memory coupled to the upstream port.

Example 19 may include the subject matter of any of examples 11-18, wherein the upstream port logic is to provide an ordered set to the register specifying one or more registers from which to provide values to the upstream port.

Example 20 is a computer program product tangibly embodied on non-transitory computer-readable media, the computer program product comprising code that when executed cause an upstream port to store one or more equalization parameter values for a downstream port in a nonvolatile memory associated with the upstream port, the downstream port coupled to the upstream port by one or more links compliant with a Peripheral Component Interconnect Express (PCIe) protocol; perform a initialization sequence of one or more input/output links between the upstream port and the downstream port, the initialization sequence comprising link training the one or more input/output links; retrieve the stored equalization parameter values for the downstream port from the nonvolatile memory; write the stored equalization parameter values for the downstream port to a register associated with the downstream port; and use the equalization parameter values as equalization parameters for the downstream port for operating the one or more links interconnecting the upstream port with the downstream port.

Example 21 may include the subject matter of example 20, wherein the code, when executed, causes the upstream port to store one or more equalization parameter values for the upstream port in the nonvolatile memory; retrieve the stored equalization parameter values for the upstream port from the nonvolatile memory; write the stored equalization parameter values for the upstream port to a register associated with the upstream port; and use the equalization parameter values as equalization parameters for the upstream port for operating the one or more links interconnecting the upstream port with the downstream port.

Example 22 may include the subject matter of example 20, wherein the code, when executed, causes the upstream port to provide a read request to a register associated with a retimer connected to one or both of the upstream port or the downstream port by one or more links; receive, from the register associated with the retimer, one or more equalization parameter values for the retimer; and store the one or more equalization parameter values for the retimer in the nonvolatile memory.

Example 23 may include the subject matter of example 22, wherein the code, when executed, causes the upstream port to retrieve, from the nonvolatile memory, the stored equalization parameter values for the retimer; write the stored equalization parameter values for the retimer to the register associated with the retimer; and use the equalization parameter values as equalization parameters for the retimer for operating one or more links interconnecting the retimer to the upstream port or one or more links interconnecting the retimer to the downstream port.

Example 24 may include the subject matter of example 20, wherein the code, when executed, causes the upstream port to determine that a retimer connected to one or both of the upstream port or the downstream port by one or more links comprises a nonvolatile memory local to the retimer; and provide an instruction to the retimer to store one or more equalization parameter values associated with the retimer in the nonvolatile memory local to the retimer.

Example 25 may include the subject matter of example 24, wherein the code, when executed, causes the upstream port to instruct the retimer to write the equalization parameter values from the nonvolatile memory local to the retimer to a register associated with the retimer; and use the equalization parameter values in the register associated with the retimer as equalization parameters for the retimer for operating one or more links interconnecting the retimer to the upstream port or one or more links interconnecting the retimer to the downstream.

Example 26 is an apparatus that may include a hardware processor coupled to a nonvolatile memory, a peripheral component interconnect express (PCIe) compliant interface coupled on a downstream device, a transmitter and receiver, and logic implemented at least partially in hardware to request from the downstream device one or more equalization parameter values; store or cause to be stored the one or more equalization parameter values in the nonvolatile memory; and instructing the downstream device to use the equalization parameter values for link training purposes.

Example 27 may include the subject matter of example 26, wherein the downstream device is a retimer.

Example 28 may include the subject matter of example 27, wherein the request comprises an identification of one or more settings register contents.

Example 29 may include the subject matter of example 27, wherein the request comprises an instruction to locally store the equalization parameter values in a nonvolatile memory local to the downstream device.

Example 30 may include the subject matter of example 26, wherein the downstream device is a peripheral component.

Example 31 is a retimer apparatus that includes a receiver coupled to a transmitter of an upstream port across a link compliant with a Peripheral Component Interconnect Express (PCIe) protocol, a transmitter coupled to a receiver of the upstream port across another PCIe compliant link; a setting register to temporarily store link training and equalization parameter values; and means for processing a request from the upstream port to store the equalization parameter values; and means for storing the equalization parameter values.

Example 32 may include the subject matter of example 31, wherein the means for processing the request includes means for reading the setting register values.

Example 33 may include the subject matter of any of examples 31 or 32, wherein means for storing the equalization parameter values includes a means for providing the equalization parameter values to the upstream port.

Example 34 may include the subject matter of any of examples 31 or 32, wherein means for storing the equalization parameter values includes a means for storing the equalization parameter values in a nonvolatile memory local to the retimer.

Example 35 may include the subject matter of example of example 31, and can also include means for receiving an instruction from the upstream port to write equalization parameter values to the settings register.

Example 36 may include the subject matter of example 35, wherein the means for receiving an instruction can include means for receiving the equalization parameter values from the upstream port.

Example 37 may include the subject matter of example 35, wherein the means for receiving an instruction can include means for receiving an instruction to write equalization parameter values from a nonvolatile memory local to the retimer to the settings register.

What is claimed is:
1. An apparatus comprising:
 a port to support a link, wherein the port is to communicate with a device over the link, the link comprises a plurality of lanes, and the port comprises:
  a plurality of transmitters;
  a plurality of receivers; and
  protocol circuitry to implement a layered interconnect protocol for the link, wherein the protocol circuitry is to:

equalize the plurality of lanes of the link, for a particular one of a plurality of data rates, during a first link training;

store equalization setting values for the plurality of lanes as determined during equalization for the particular data rate in the first link training;

determine, in association with a second link training, that the device supports skipping equalization for the particular data rate; and apply the stored equalization setting values to the plurality of transmitters to skip equalization for the particular data rate in the second link training.

2. The apparatus of claim 1, wherein the protocol circuitry is to receive an ordered set from the device during the second link training, wherein the ordered set comprises a field to indicate that the device supports skipping equalization for the particular data rate.

3. The apparatus of claim 2, wherein the ordered set comprises a training sequence to be sent in the first link training.

4. The apparatus of claim 3, wherein the training sequence comprises one of a TS1 ordered set or a TS2 ordered set.

5. The apparatus of claim 4, wherein the TS1 ordered set comprises a Peripheral Component Interconnect Express (PCIe)-based TS1 ordered set and the TS2 ordered set comprises a PCIe-based TS2 ordered set.

6. The apparatus of claim 2, wherein the protocol circuitry is to send another ordered set to the device during the second link training, wherein the other ordered set comprises a field to indicate that the port supports skipping equalization for the particular data rate.

7. The apparatus of claim 1, wherein the second link training is to be performed following a reset of the link.

8. The apparatus of claim 1, wherein the equalization in the first link training comprises equalizing the plurality of lanes at each of the plurality of data rates and equalization setting values determined for each of the plurality of data rates in the first link training are stored.

9. The apparatus of claim 1, wherein the equalization setting values are stored in local memory.

10. The apparatus of claim 9, wherein the local memory comprises non-volatile memory.

11. The apparatus of claim 1, wherein system software is used to store the equalization setting values.

12. The apparatus of claim 1, wherein the equalization setting values are stored in a register associated with the port.

13. The apparatus of claim 12, wherein the register is in configuration space associated with the port.

14. The apparatus of claim 1, wherein the equalization setting values comprise one of a transmitter preset value, a pre-cursor value, a post-cursor value, or a cursor value.

15. The apparatus of claim 1, wherein the protocol circuitry is to perform equalization for a lowest one of a plurality of data rates in the second link training, and applies the stored equalization setting values to the plurality of transmitters after completion of the equalization for the lowest data rate.

16. A method comprising:

participating in a first equalization of a plurality of physical lanes of a link, at a particular one of a plurality of data rates, during a first link training, wherein the link couples a first device to a second device;

storing equalization setting values for the plurality of lanes as determined during the first equalization for the particular data rate;

participating in an initialization of the link subsequent to the first equalization;

determining, in a second link training associated with the initialization, that the second device supports skipping equalization for the particular data rate; and applying the stored equalization setting values to a plurality of transmitters to skip equalization for the particular data rate in the second link training.

17. The method of claim 16, further comprising receiving, at the first device, an ordered set from the second device during the second link training, wherein the ordered set comprises a field to indicate that the second device supports skipping equalization for the particular data rate.

18. The method of claim 17, further comprising sending another ordered set from the first device to the second device during the second link training, wherein the ordered set comprises a field to indicate that the first device supports skipping equalization for the particular data rate.

19. The method of claim 16, further comprising:

entering an active link state following the second link training; and sending data from the first device to the second device over the link in the active link state based on the stored equalization setting values applied to the plurality of transmitters.

20. The method of claim 16, further comprising determining, during the second link training, that the particular data rate comprises a highest data rate supported by both the first device and the second device.

21. A system comprising:

a first device; and a second device connected to the first device by a physical interconnect, wherein the interconnect comprises a plurality of lanes to implement a link, the first device and the second device are to communicate over the link, and the second device comprises:

a plurality of transmitters to send data to the first device on the link;

a plurality of receivers to receive data from the first device on the link; and protocol circuitry to:

participate in a first equalization of the plurality of lanes at a particular data rate during a first training of the link;

determine equalization setting values for the plurality of transmitters during the first equalization;

store equalization setting values for the plurality of lanes as determined during the first equalization for the particular data rate;

determine, in a subsequent second training of the link, that the first device supports skipping equalization for the particular data rate; and apply the stored equalization setting values to the plurality of transmitters to skip equalization for the particular data rate in the second link training.

22. The system of claim 21, wherein the particular data rate is one of a plurality of data rates supported on the link and the first equalization comprises:

performing an equalization for each one of the plurality of data rates;

determining equalization settings for each of the plurality of data rates; and storing equalization settings for each of the plurality of data rates for future use.

23. The system of claim 21, further comprising a retimer positioned between the first and second devices on the link.

24. The system of claim 23, wherein the protocol circuitry is further to send a request to the retimer to use determined retimer equalization parameter values stored in a register of the retimer in the second training of the link, wherein the retimer reads the retimer equalization parameter values from the register and sends an indication of the retimer equalization parameters values to the first device or the second device.

25. The system of claim 21, wherein the first device comprises a host processor and the second device comprises a Peripheral Component Interconnect Express (PCIe) endpoint device.

26. The system of claim 21, wherein the link is compliant with a PCIe-based protocol.

27. An apparatus comprising:
a port to support a link, wherein the port is to communicate with a device over the link, the link comprises a plurality of lanes, and the port comprises:
  a plurality of transmitters;
  a plurality of receivers; and
  protocol circuitry to implement a layered interconnect protocol for the link, wherein the link supports a plurality of data rates, and the protocol circuitry is to:
    receive an ordered set from the device during training of the link, wherein the ordered set comprises a field to indicate whether the device supports skipping equalization for a particular one of the plurality of data rates; and
    determine whether the device supports skipping a subsequent equalization for the particular data rate based on a value in the field.

* * * * *